(12) United States Patent
Yang et al.

(10) Patent No.: US 12,230,740 B2
(45) Date of Patent: Feb. 18, 2025

(54) LIGHT-EMITTING DEVICE AND MANUFACTURING METHOD THEREOF

(71) Applicant: EPISTAR CORPORATION, Hsinchu (TW)

(72) Inventors: Jhih-Yong Yang, Hsinchu (TW);
Hsin-Ying Wang, Hsinchu (TW);
De-Shan Kuo, Hsinchu (TW);
Chao-Hsing Chen, Hsinchu (TW);
Yi-Hung Lin, Hsinchu (TW);
Meng-Hsiang Hong, Hsinchu (TW);
Kuo-Ching Hung, Hsinchu (TW);
Cheng-Lin Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 394 days.

(21) Appl. No.: 17/237,825

(22) Filed: Apr. 22, 2021

(65) Prior Publication Data

US 2021/0336090 A1 Oct. 28, 2021

(30) Foreign Application Priority Data

Apr. 23, 2020 (TW) .................................. 109113677
Aug. 14, 2020 (TW) .................................. 109127657

(51) Int. Cl.
*H01L 33/46* (2010.01)
*H01L 27/15* (2006.01)
(Continued)

(52) U.S. Cl.
CPC ............ *H01L 33/46* (2013.01); *H01L 27/156* (2013.01); *H01L 33/10* (2013.01); *H01L 33/382* (2013.01); *H01L 33/62* (2013.01)

(58) Field of Classification Search
CPC ....... H01L 33/46; H01L 27/156; H01L 33/10; H01L 33/382; H01L 33/62; H01L 33/44;
(Continued)

(56) References Cited

U.S. PATENT DOCUMENTS

2015/0034985 A1* 2/2015 Tomizawa .............. H01L 33/60
257/98
2017/0331009 A1* 11/2017 Shioji ................... H01L 33/502
(Continued)

FOREIGN PATENT DOCUMENTS

CN 110223999 A 9/2019
TW 202006978 2/2020

*Primary Examiner* — Su C Kim
(74) *Attorney, Agent, or Firm* — DITTHAVONG, STEINER & MLOTKOWSKI

(57) ABSTRACT

A light-emitting device includes a semiconductor stack including a first semiconductor layer, a second semiconductor layer and an active area between the first semiconductor layer and the second semiconductor layer, wherein the first semiconductor layer including an upper surface; an exposed region formed in the semiconductor stack to expose the upper surface; a first protective layer covering the exposed region and a portion of the second semiconductor layer, wherein the first protective layer includes a first part with a first thickness formed on the upper surface and a second part with a second thickness formed on the second semiconductor layer, the first thickness is smaller than the second thickness; a first reflective structure formed on the second semiconductor layer and including one or multiple openings; and a second reflective structure formed on the first reflective structure and electrically connected to the second semiconductor layer through the one or multiple openings.

19 Claims, 28 Drawing Sheets

(51) Int. Cl.
*H01L 33/10* (2010.01)
*H01L 33/38* (2010.01)
*H01L 33/62* (2010.01)

(58) Field of Classification Search
CPC ..... H01L 33/387; H01L 33/405; H01L 33/20; H01L 33/0095
See application file for complete search history.

(56) References Cited

U.S. PATENT DOCUMENTS

| | | | |
|---|---|---|---|
| 2017/0365745 A1* | 12/2017 | Yang | H01L 33/44 |
| 2018/0138372 A1* | 5/2018 | Kim | H01L 33/42 |
| 2018/0204980 A1* | 7/2018 | Obata | H01L 33/40 |
| 2019/0229242 A1* | 7/2019 | Yoon | H01L 33/382 |
| 2019/0237626 A1* | 8/2019 | Yoon | H01L 33/46 |

* cited by examiner

B-B'

C-C'

B-B'

C-C'

LIGHT-EMITTING DEVICE AND MANUFACTURING METHOD THEREOF

CROSS-REFERENCE TO RELATED APPLICATIONS

This application claims priority to the benefit of Taiwan Patent Application Number 109113677 filed on Apr. 23, 2020 and Taiwan Patent Application Number 109127657 filed on Aug. 14, 2020, and the entire contents of which are hereby incorporated by reference herein in their entireties.

BACKGROUND

Technical Field

The present disclosure relates to a light-emitting device, more specifically, to a light-emitting device including a protective layer.

Description of the Related Art

The light-emitting diodes (LEDs) have the characteristics of low power consumption, low heat-generation, long lifetime, small size, high response speed and good photoelectric property, such as stable light-emitting wavelength. Therefore, the light-emitting diodes (LEDs) are widely used in household appliances, indicator lights and optoelectronic products.

The conventional light-emitting diode includes a substrate, an n-type semiconductor layer, an active area and a p-type semiconductor layer formed on the substrate, and p-electrode and n-electrode respectively formed on the p-type semiconductor layer and the n-type semiconductor layer. When the light-emitting diode is energized through the electrodes with a forward bias at a specific value, holes form the p-type semiconductor layer and electrons from the n-type semiconductor layer are combined in the active area to emit light.

SUMMARY OF THE DISCLOSURE

A light-emitting device includes a semiconductor stack including a first semiconductor layer, a second semiconductor layer and an active area between the first semiconductor layer and the second semiconductor layer, wherein the first semiconductor layer including an upper surface; an exposed region formed in the semiconductor stack to expose the upper surface; a first protective layer covering the exposed region and a portion of the second semiconductor layer, wherein the first protective layer includes a first part formed on the upper surface and a second part formed on the second semiconductor layer, the first part has a first thickness and the second part has a second thickness, and the first thickness is smaller than the second thickness; a first reflective structure formed on the second semiconductor layer and including one or multiple openings; and a second reflective structure formed on the first reflective structure and electrically connected to the second semiconductor layer through the one or multiple openings.

A light-emitting device includes a semiconductor stack including a first semiconductor layer, a second semiconductor layer and an active area between the first semiconductor layer and the second semiconductor layer, wherein the first semiconductor layer including an upper surface; an exposed region formed in the semiconductor stack to expose the upper surface; a first protective layer covering the exposed region and a portion of the second semiconductor layer; an etch stop layer formed on the second semiconductor layer; a first reflective structure formed on the etch stop layer and including one or multiple openings exposing the etch stop layer; a second reflective structure formed on the first reflective structure and electrically connected to the second semiconductor layer through the one or multiple openings and the etch stop layer; an electrode formed on the second reflective structure; a second protective layer formed on the electrode, covering the exposed region and including a hole to expose the electrode; and a pad electrically connected to the electrode through the hole.

DETAILED DESCRIPTION OF THE EMBODIMENTS

Figure 1A:
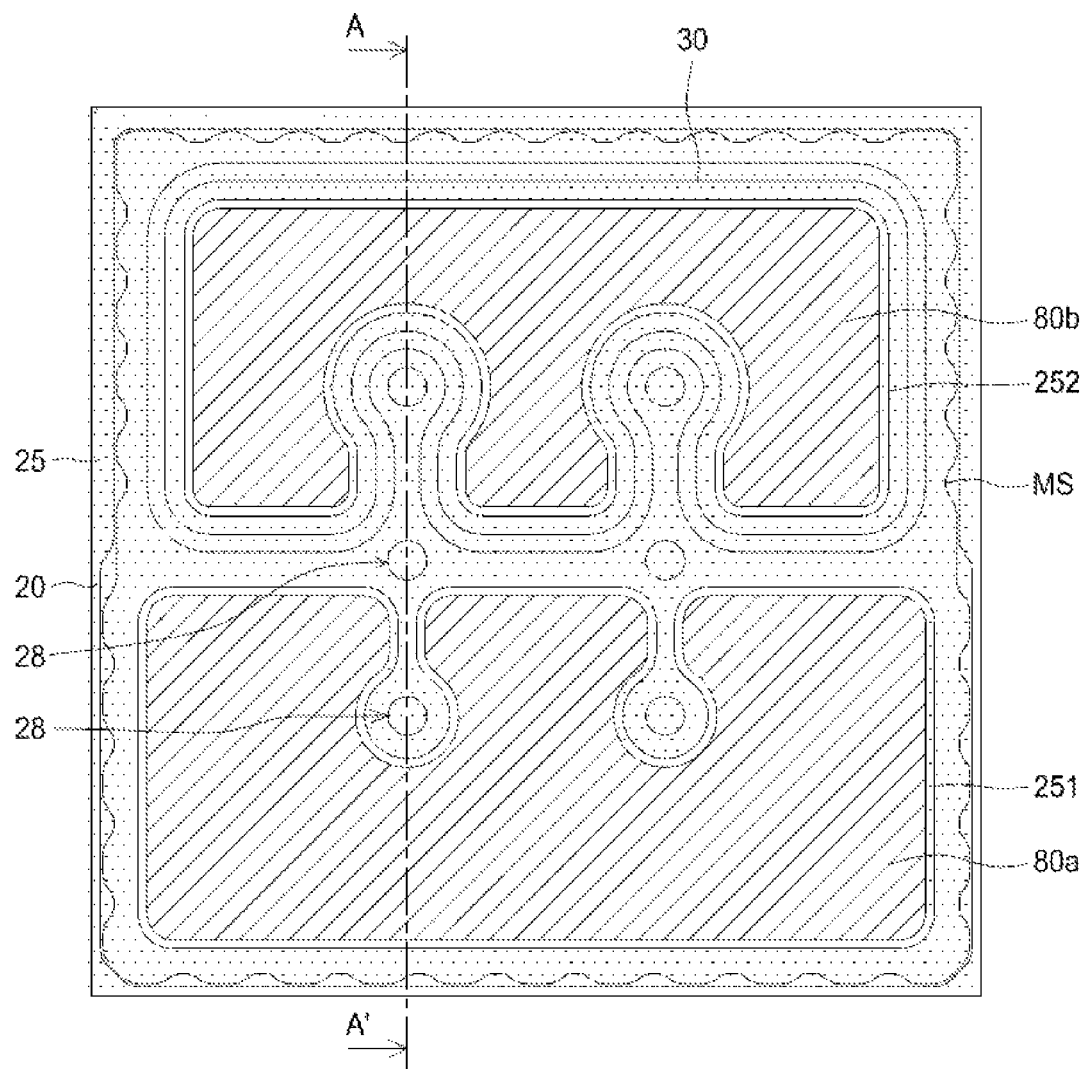
FIG. 1A shows a top view of the light-emitting device 1 or 2 in accordance with an embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 2A:
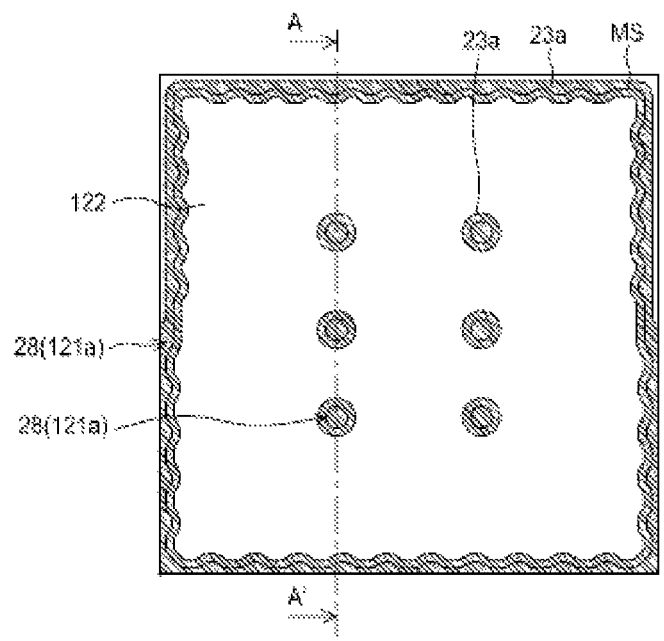
FIGS. 2A-2H show top views of the light-emitting device 1 in corresponding manufacturing steps.
Figure 2B:
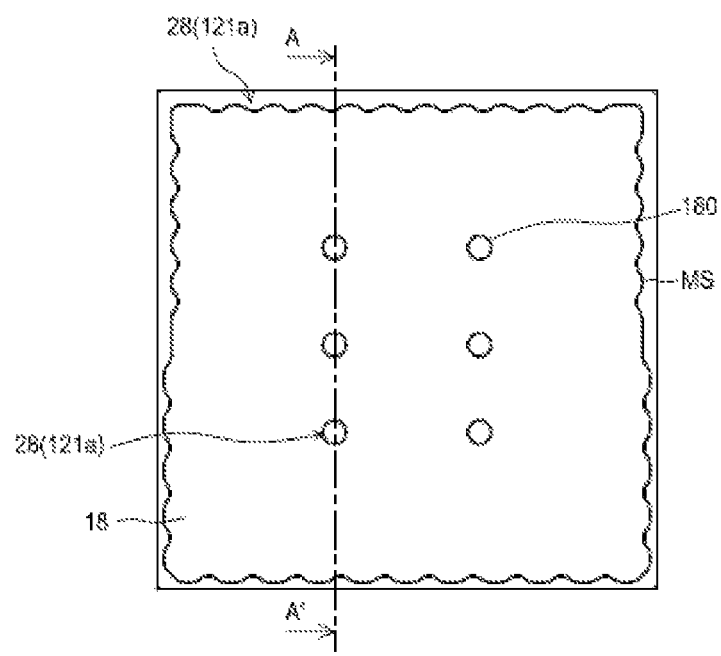

FIG. 1A shows a top view of the light-emitting device 1 in accordance with an embodiment of the present application. FIGS. 2A-2H show top views of the light-emitting device 1 in corresponding manufacturing steps. FIGS. 3A-3F show cross-sectional views of the light-emitting device 1 in corresponding manufacturing steps. The manufacturing method of the light-emitting device 1 is described in detail as follows. First, referring to FIG. 2A and FIG. 3A, a semiconductor stack 12 is formed on a substrate 10, and a lower protective layer 23a is formed on the semiconductor stack. Next, referring to FIG. 2B and FIG. 3A, a transparent conductive layer 18 is formed on the semiconductor stack 12. FIG. 3A shows a cross-sectional view along the line A-A' after the manufacturing steps of FIG. 2A and FIG. 2B are completed. The substrate 10 may be a wafer, and the substrate 10 and the semiconductor stack 12 on the substrate 10 form a semiconductor wafer. The semiconductor wafer is separated into a plurality of light-emitting devices 1 after the dicing process. The figures and the descriptions of the following embodiment will use a single light-emitting device 1 as a representative.

The substrate 10 can be a growth substrate, including a substrate for growing AlGaInP semiconductor thereon, such as GaAs substrate or GaP substrate, or a substrate for growing InGaN or AlGaN thereon, such as sapphire substrate, GaN substrate, SiC substrate, or AlN substrate. The substrate 10 includes a substrate surface 10a. The substrate 10 can be a patterned substrate which has a plurality of patterned structures on the substrate surface 10a (not shown). In an embodiment, the light emitted from the semiconductor stack 12 can be refracted and/or reflected by the patterned structures of the substrate 10 so the brightness of the light-emitting device 1 can be improved. In addition, the patterned structures suppress the dislocation between the substrate 10 and the semiconductor stack 12 caused by the lattice mismatch so the epitaxial quality of the semiconductor stack 12 can be improved.

In an embodiment of the present application, the semiconductor stack 12 is formed on the substrate 10 by epitaxy processes such as metal-organic chemical vapor deposition (MOCVD), molecular beam epitaxy (MBE), hydride vapor epitaxy (HVPE), or physical vapor deposition such as sputtering or evaporating.

In an embodiment, a buffer structure (not shown), a first semiconductor layer 121, an active area 123 and a second semiconductor layer 122 sequentially formed on the substrate 10. The buffer structure, the first semiconductor layer 121, the active area 123 and the second semiconductor layer 122 constitute the semiconductor stack 12. The buffer structure can reduce the lattice mismatch and suppress the dislocation, thereby improving the epitaxial quality. The material of the buffer structure includes GaN, AlGaN, or AlN. In an embodiment, the buffer structure includes a plurality of sub-layers (not shown). The sub-layers include the same material or different materials. In an embodiment, the buffer structure includes two sub-layers, wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment of the present application, the first semiconductor layer 121 and the second semiconductor layer 122 are, for example, a cladding layer or a confinement layer having different conductivity types, different electrical properties, different polarities, or different dopants for providing electrons or holes. For example, the first semiconductor layer 121 is an n-type semiconductor and the second semiconductor layer 122 is a p-type semiconductor. The active area 123 is formed between the first semiconductor layer 121 and the second semiconductor layer 122. Driven by a current, electrons and holes are combined in the active area 123 to convert electrical energy into optical energy for illumination. The wavelength of the light emitted by the light-emitting device 1 or the semiconductor stack 12 can be adjusted by changing the physical properties and chemical composition of one or more layers in the semiconductor stack 12.

The material of the semiconductor stack 12 includes III-V semiconductor like $Al_xIn_yGa_{(1-x-y)}N$ or $Al_xIn_yGa_{(1-x-y)}P$, where 0≤x, y≤1; x+y≤1. When the material of the semiconductor stack 12 includes AlInGaP, the semiconductor stack 12 emits red light having a wavelength between 610 nm and 650 nm or yellow light having a wavelength between 550 nm and 570 nm. When the material of the semiconductor stack 12 includes InGaN, the semiconductor stack 12 emits blue light or deep blue light having a wavelength between 400 nm and 490 nm or green light having a wavelength between 490 nm and 550 nm. When the material of the semiconductor stack 12 includes AlGaN, the semiconductor stack 12 emits UV light having a wavelength between 250 nm and 400 nm. The active area 123 can be a single hetero-structure (SH), a double hetero-structure (DH), a double-side double hetero-structure (DDH), or a multi-quantum well (MQW). The material of the active area 123 can be i-type, p-type, or n-type.

Next, an exposed region 28 is formed. As shown in FIG. 3A, in this step, a portion of the second semiconductor layer 122, the active area 123 and the first semiconductor layer 121 are removed to expose an upper surface 121a of the first semiconductor layer 121 to form an exposed region 28. Referring to FIG. 2A, the semiconductor stack 12 located at a region other than the exposed region 28 forms a mesa MS. In this embodiment, as shown in FIG. 2A, the contour of the mesa MS is wavy, zigzag, square wave or other non-linear patterns. The pattern of the contour of the mesa MS can improve the light extraction efficiency of the light-emitting device 1. In an embodiment, the exposed region 28 includes a surrounding region surrounding the semiconductor stack 12 and inner region distributed in the semiconductor stack 12. Each exposed region 28 includes a first sidewall formed by a side surface of the semiconductor stack 12 and a bottom formed by the upper surface 121a of the first semiconductor layer 121. Then, in an embodiment, a portion of the first semiconductor layer 121 located around the semiconductor stack 12 and outside the surrounding region is further removed to expose the substrate surface 10a of the substrate 10 to form an isolation region ISO. The isolation region ISO serves as the location for dividing line (not shown) in the dicing process that separates and defines the light-emitting devices 1.

As shown in FIG. 2A and FIG. 3A, a lower protective layer 23a is formed on the exposed region 28. The lower protective layer 23a covers the first sidewall and the bottom of the exposed region 28 and a portion of the second semiconductor layer 122. In an embodiment, the lower protective layer 23a further covers the side wall of the first semiconductor layer 121 around the semiconductor stack 12.

The lower protective layer 23a is transparent to the light emitted by the semiconductor stack 12. The material of the lower protective layer 23a is an insulating material, which includes an organic material or an inorganic material. The organic material includes SU-8 photoresist, benzocyclobutene (BCB), perfluorocyclobutane (PFCB), epoxy resin, acrylic resin, cycloolefin polymer (COC), polymethylmethacrylate (PMMA), polyethylene terephthalate (PET), polycarbonate (PC), polyetherimide (PEI), polyimide (PI) or fluorocarbon polymer. The inorganic material includes silicon, glass, silicon oxide, silicon nitride, silicon oxynitride, niobium oxide, hafnium oxide, titanium oxide, magnesium fluoride, or aluminum oxide. The lower protective layer 23a can be formed by atomic layer deposition (ALD), sputtering, evaporation, or spin-coating.

In order to clearly show the top views of each manufacturing step of the light-emitting device 1, FIGS. 2B-2H only show the mesa MS, the layer formed in the current manufacturing step, or the layer formed in the previous manufacturing step of the current manufacturing step.

After the lower protective layer 23a is formed, referring to FIG. 2B and FIG. 3A, a transparent conductive layer 18 is formed. FIG. 2B only shows the mesa MS and the transparent conductive layer 18. The transparent conductive layer 18 covers the second semiconductor layer 122 and is electrically connected to the second semiconductor layer 122. The transparent conductive layer 18 includes one or multiple vias 180 correspondingly formed on the exposed region 28. The material of the transparent conductive layer 18 includes metal or transparent conductive oxide material. The transparent conductive layer 18 can be a thin film with high transparency made of metal. The transparent conductive oxide material is transparent to the light emitted from the active area 123, such as indium tin oxide (ITO), zinc oxide (ZnO), aluminum zinc oxide (AZO), gallium zinc oxide (GZO) or indium zinc oxide (IZO). In an embodiment, the transparent conductive layer 18 covers a portion of the lower protective layer 23a. In another embodiment, the transparent conductive layer 18 does not cover the lower protective layer 23a. In another embodiment, the transparent conductive layer 18 may be formed first, and then the lower protective layer 23a may be formed.

Figure 2C:
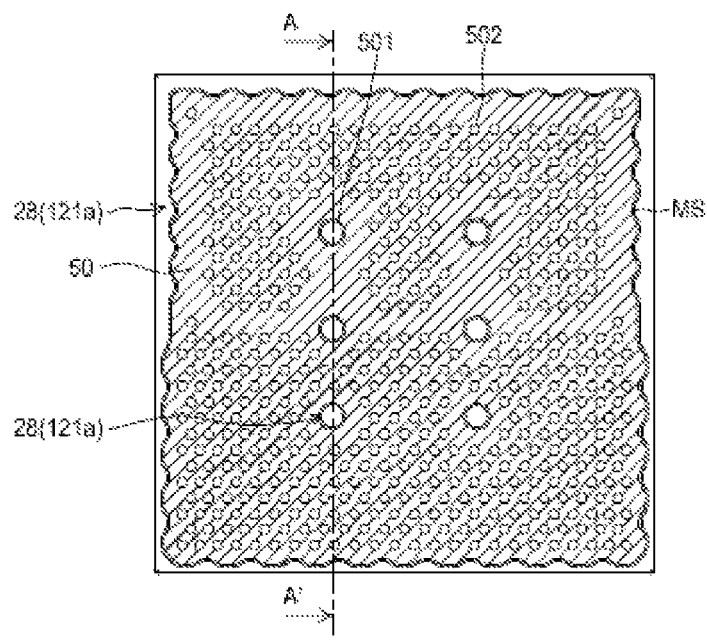
Figure 3A:
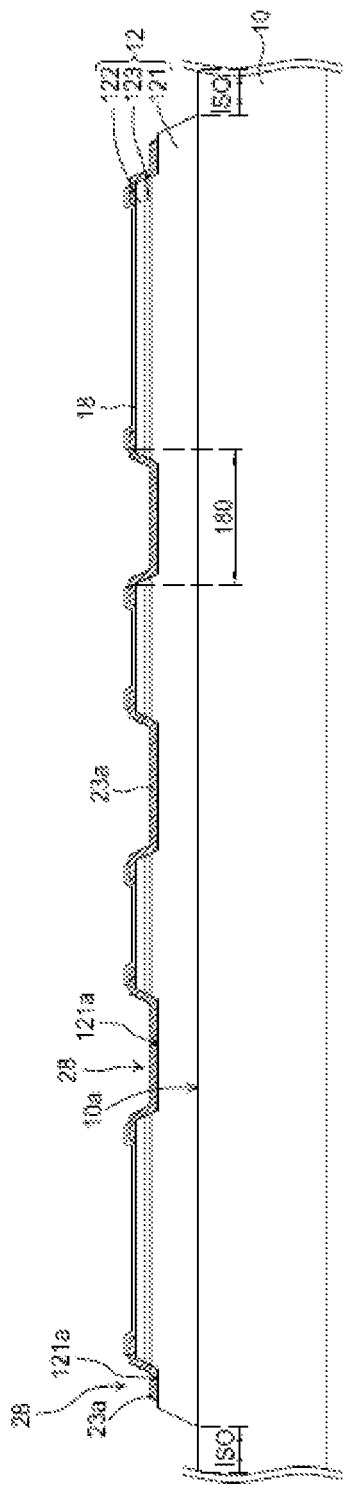
FIGS. 3A-3F show cross-sectional views of the light-emitting device 1 in corresponding manufacturing steps.
Figure 3B:
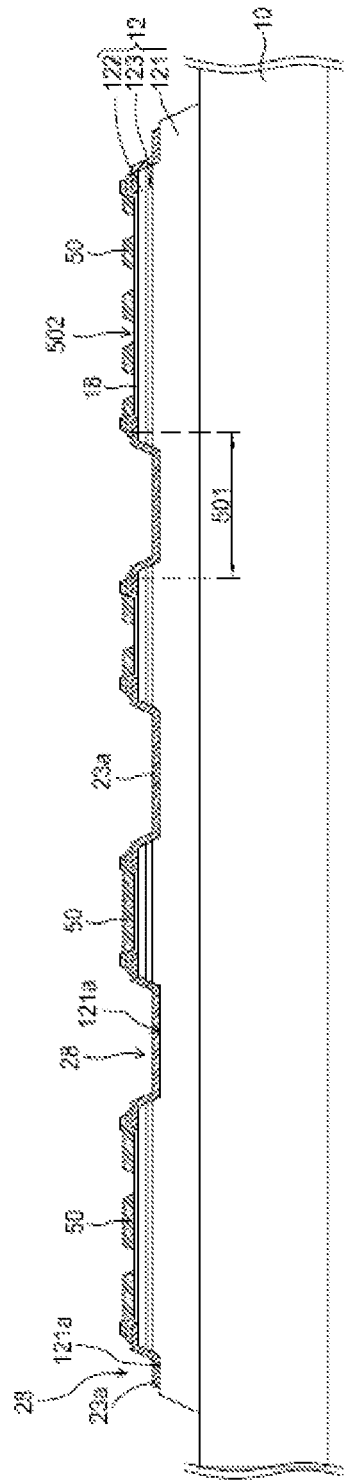
Figure 3C:
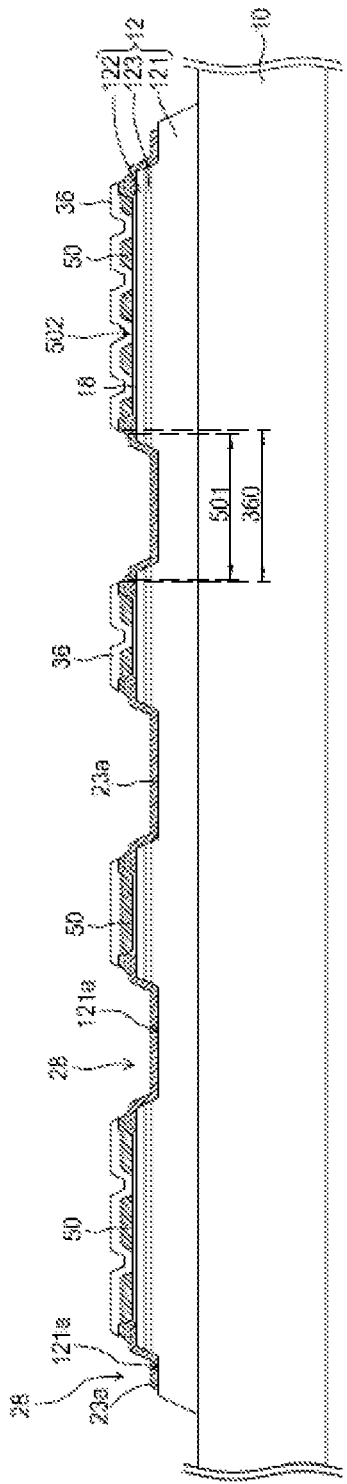

Next, referring to FIG. 2C and FIGS. 3B-3C, a first reflective structure 50 is formed. FIG. 3B shows the cross-sectional view along the line A-A' after the manufacturing steps of FIGS. 2A-2C are completed. FIG. 2C only shows the mesa MS and the first reflective structure 50. First, a material layer of the first reflective structure 50 is formed on the second semiconductor layer 122 and one or multiple first openings 501 and one or multiple second openings 502 separated from each other are formed in the material layer of the first reflective structure 50 by lithography and etching, then the first reflective structure 50 is formed. The one or multiple first openings 501 corresponding to the exposed region 28 and the one or multiple vias 180. The one or multiple second openings 502 are distributed on the second semiconductor layer 122 and expose the transparent conductive layer 18.

Figure 5A:
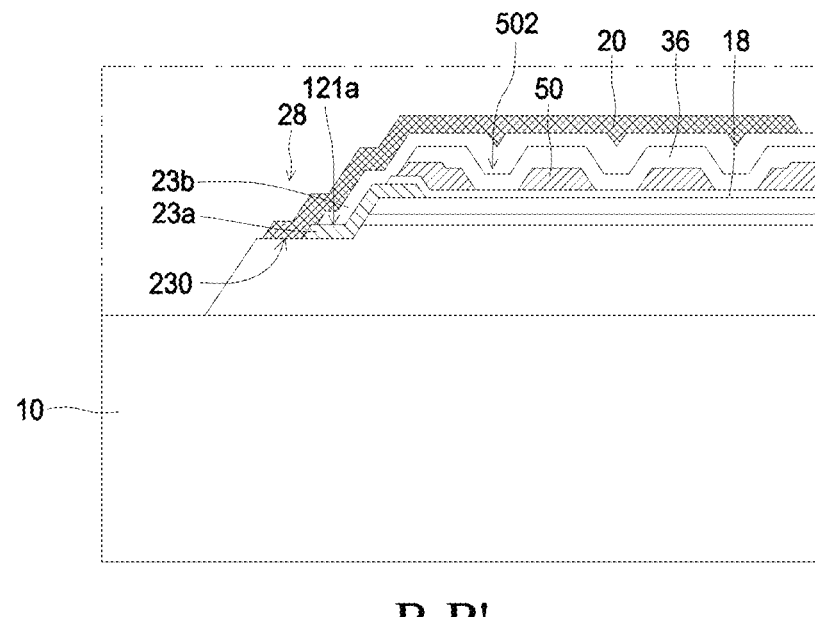
FIGS. 5A-5B show partial cross-sectional views of the light-emitting device 1 in corresponding manufacturing steps.
Figure 6A:
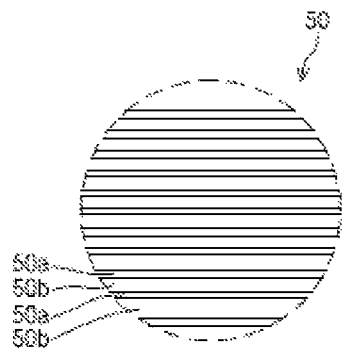
FIGS. 6A-6B show enlarged partial cross-sectional views of the first reflective structure 50 of the light-emitting device 1.

In an embodiment, FIG. 6A shows an enlarged partial cross-sectional view of the first reflective structure 50, which is formed of alternately stacking a pair or a plurality of pairs of materials with different refractive indexes. In this embodiment, as shown in FIG. 5A, the first reflective structure 50 includes a stack of materials, such as dielectric materials, which is a pair of dielectric materials formed of alternately stacking a first sub-layer 50a and a second sub-layer 50b. The first sub-layer 50a and the second sub-layer 50b form a pair of dielectric materials. The first sub-layer 50a has a refractive index higher than that of the second sub-layer 50b. In an embodiment, the first sub-layer 50a has a thickness smaller than that of the second sub-layer 50b. The dielectric materials include silicon oxide, silicon nitride, silicon oxynitride, niobium oxide, hafnium oxide, titanium oxide, magnesium fluoride, or aluminum oxide. The first reflective structure 50 can be a distributed Bragg reflector (DBR), which is formed of a material stack with different refractive indexes and thickness arranged to reflect the light of a specific wavelength range.

In an embodiment, the first reflective structure 50 further includes a layer other than the first sub-layer 50a and the second sub-layer 50b. For example, the first reflective structure 50 further includes a bottom layer (not shown) between the first sub-layer 50a (and/or the second sub-layer 50b) and the semiconductor stack 12. That is, the bottom layer is formed on the semiconductor stack 12 first, and then the first sub-layer 50a and the second sub-layer 50b are formed. The bottom layer is a non-conductive material including organic material or inorganic material, wherein the inorganic material can be a dielectric material. The thickness of the bottom layer is greater than the thicknesses of the first sub-layer 50a and the second sub-layer 50b. In an embodiment, the formation process of the bottom layer is different from the formation processes of the first sub-layer 50a and the second sub-layer 50b. For example, the bottom layer is formed by chemical vapor deposition (CVD) or plasma enhanced chemical vapor deposition (PECVD), and the first sub-layer 50a and the second sub-layer 50b are formed by sputtering.

Figure 6B:
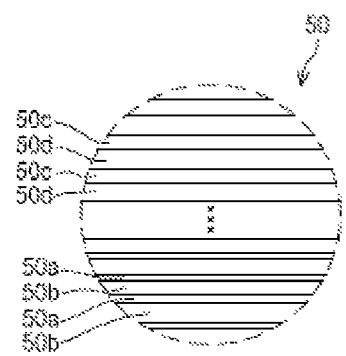

In another embodiment, as shown in FIG. 6B, the first reflective structure 50 includes a plurality of material stacks. The first material stack is formed of alternately stacking the first sub-layer 50a and the second sub-layer 50b. The second material stack is formed of alternately stacking the third sub-layer 50c and the fourth sub-layer 50d. In an embodiment, the second material stack includes dielectric materials, which is a pair of dielectric materials formed of the third sub-layer 50c and the fourth sub-layer 50d. The third sub-layer 50c has a refractive index higher than that of the fourth sub-layer 50d. In an embodiment, the third sub-layer 50c has a thickness smaller than that of the fourth sub-layer 50d. In an embodiment, the thickness of the third sub-layer 50c is different from that of the first sub-layer 50a, the material of the third sub-layer 50c and that of the first sub-layer 50a are the same or different. The thickness of the fourth sub-layer 50d is different from that of the second sub-layer 50b and the material of the fourth sub-layer 50d and that of the second sub-layer 50b are the same or different.

In another embodiment, the first reflective structure 50 further includes an upper layer (not shown) formed on the first sub-layer 50a (and/or the second sub-layer 50b), that is, the upper layer is formed on a side of the first reflective structure 50 away from the semiconductor stack 12. The first sub-layer 50a and the second sub-layer 50b are formed first, and then the upper layer is formed. The upper layer is a non-conductive material including organic material or inorganic material, wherein the inorganic material can be a dielectric material. The thickness of the upper layer is greater than the thicknesses of the first sub-layer 50a and the second sub-layer 50b. In an embodiment, the formation process of the upper layer is different from the formation processes of the first sub-layer 50a and the second sub-layer 50b. For example, the upper layer is formed by chemical vapor deposition (CVD) or plasma enhanced chemical vapor deposition (PECVD), and the first sub-layer 50a and the second sub-layer 50b are formed by sputtering.

In another embodiment, the first reflective structure 50 includes a plurality of material stacks and a bottom layer and/or an upper layer. In another embodiment, before forming the first reflective structure 50, a compact layer (not shown) is formed on the substrate surface 10a and the semiconductor stack 12 by atomic deposition to directly cover the semiconductor stack 12. In an embodiment, the compact layer can cover and fill the surface defects of the semiconductor stack 12 to prevent the moisture. The material of the compact layer includes silicon oxide, aluminum oxide, hafnium oxide, tantalum oxide, zirconium oxide, yttrium oxide, lanthanum oxide, tantalum oxide, silicon nitride, aluminum nitride, or silicon oxynitride. In this embodiment, the interface between the compact layer and the semiconductor stack 12 includes metal and oxygen, and the metal includes aluminum, hafnium, tantalum, zirconium, yttrium, lanthanum, or tantalum. The compact layer has a thickness between 50 Å and 2000 Å, preferably between 100 Å and 1500 Å.

In an embodiment, the thickness of the first reflective structure 50 is between 0.3 μm and 6 μm. In an embodiment, the angle between the transparent conductive layer 18 and the side wall of the first reflective structure 50 is between 5 degrees and 80 degrees. The side wall of the first reflective structure 50 can be the sidewall of the first opening 501 and/or the second opening 502.

In an embodiment, the first reflective structure 50 does not include the second opening 502 between the adjacent first opening s 501. In an embodiment, the first reflective structure 50 includes a plurality of separated islands (not shown) distributed on the second semiconductor layer 122 instead of the openings shown in FIG. 2C.

Figure 2D:
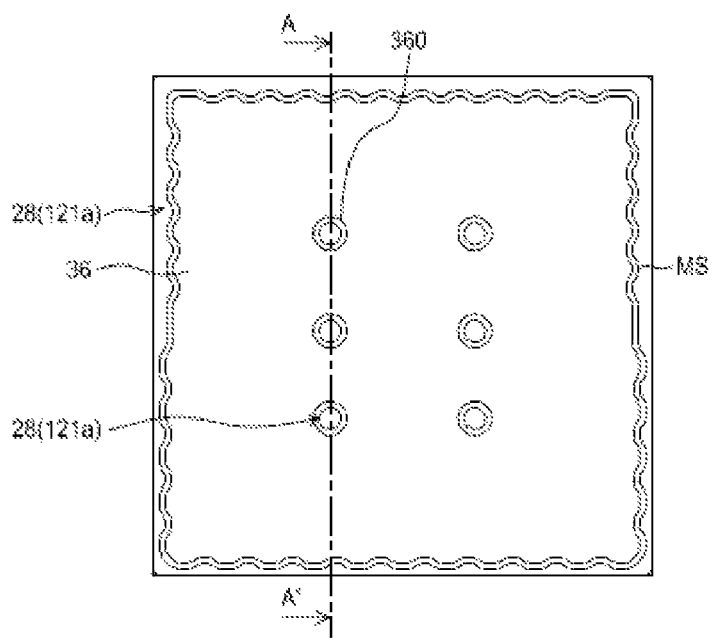

Next, referring to FIG. 2D and FIG. 3C, a second reflective structure 36 is formed. FIG. 3C shows a cross-sectional view along the line A-A' after the manufacturing steps of FIGS. 2A-2D are completed. FIG. 2D only shows the mesa MS and the second reflective structure 36. The second reflective structure 36 is formed on the transparent conductive layer 18 and the first reflective structure 50, and is electrically connected to the second semiconductor layer 122 through the one or multiple second openings 502 and the transparent conductive layer 18. The second reflective structure 36 includes one or multiple third openings 360 formed on the exposed region 28 and corresponding to the one or multiple first openings 501. The second reflective structure 36 includes a metal structure including a single metal layer or a stack of multiple metal layers. In an embodiment, the second reflective structure 36 includes a first barrier layer (not shown) and a reflective layer (not shown), and the first barrier layer is formed on the reflective layer and covers the reflective layer to prevent the migration, diffusion or oxidation of metal elements in the reflective layer. The material of the reflective layer includes a metal material with high reflectivity for the light emitted by the semiconductor stack 12, such as silver (Ag), gold (Au), aluminum (Al), titanium (Ti), chromium (Cr), copper (Cu), nickel (Ni), platinum (Pt), ruthenium (Ru) or alloys or stacks of the above materials. The material of the first barrier layer includes chromium (Cr), platinum (Pt), titanium (Ti), tungsten (W), zinc (Zn), or alloys or stack of the above materials. In an embodiment, the first barrier layer is a metal stack formed by alternately stacking two or more layers of metal, such as Cr/Pt, Cr/Ti, Cr/TiW, Cr/W, Cr/Zn, Ti/Pt, Ti/W, Ti/TiW, Ti/Zn, Pt/TiW, Pt/W, Pt/Zn, TiW/W, TiW/Zn, or W/Zn. In another embodiment (not shown), the first reflective structure 50 includes a plurality of separated islands distributed on the second semiconductor layer 122 while the second reflective structure 36 is electrically connected to the transparent conductive layer 18 and the second semiconductor layer 122 through the gap between the islands.

Figure 2E:
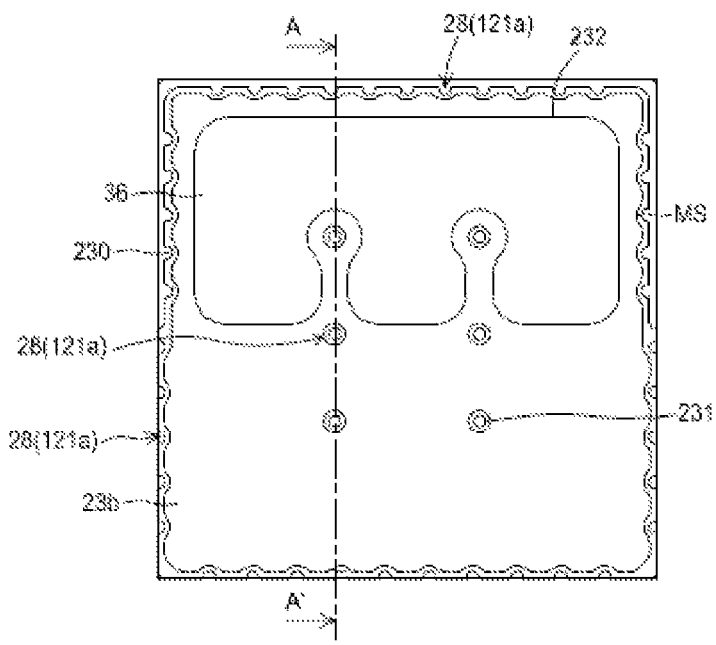
Figure 3D:
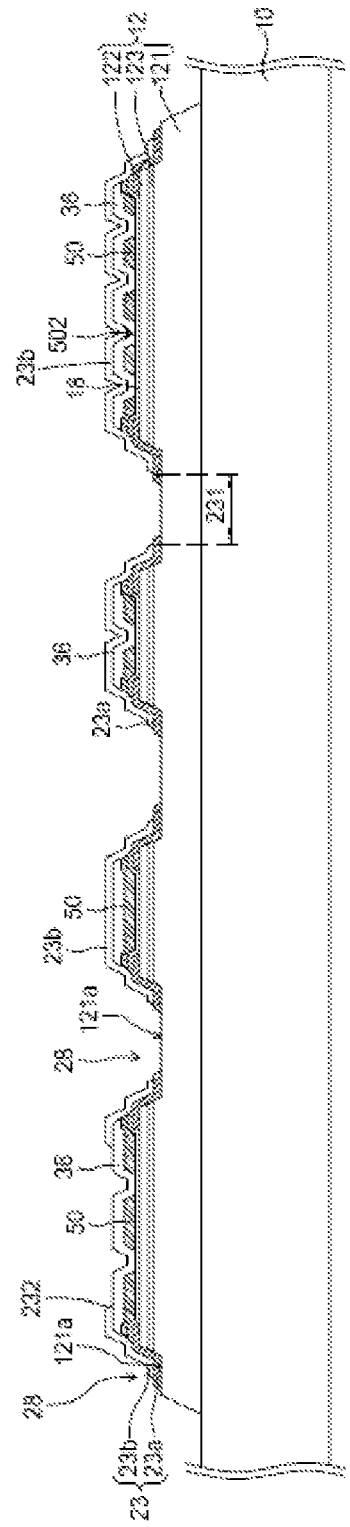

Referring to FIG. 2E and FIG. 3D, an upper protective layer 23b is formed. FIG. 3D shows a cross-sectional view along the line A-A' after the manufacturing steps of FIGS. 2A-2E are completed. FIG. 2E only shows the mesa MS, the second reflective structure 36 and the upper protective layer 23b. The upper protective layer 23b is formed on the second reflective structure 36 and covers a portion of the second reflective structure 36 and the lower protective layer 23a. At the exposed region 28 and near the exposed region 28, the upper protective layer 23b connects to and overlaps the lower protective layer 23a.

The upper protective layer 23b includes one or multiple first holes 230, second holes 231 and third holes 232. As shown in FIG. 2E, the first holes 230 are arranged at intervals around the upper protective layer 23a and expose the bottom of the exposed region 28, that is, the upper surface 121a of the first semiconductor layer 121. The third hole 232 exposes the second reflective structure 36. In this embodiment, only a third hole 232 is shown, but the present application is not limited to this. The upper protective layer 23b may include a plurality of third holes 232 to respectively expose the second reflective structure 36. In one embodiment, an insulating material is first formed to cover the second reflective structure 36 and the exposed region 28, and then the first holes 230, the second hole 231, and the third hole 232 are formed by lithography and etching to form the upper protective layer 23b. While forming the first holes 230 and the second hole 231, the lower protective layer 23a directly under the first holes 230 and the second hole 231 is also removed. The upper protective layer 23b and the lower protective layer 23a constitute a first protective layer 23, and the material of the upper protective layer 23b and the material of the lower protective layer 23a may be the same or different. That is, the first protective layer 23 has the first holes 230 arranged at intervals around it to expose the upper surface 121a of the first semiconductor layer, and the second holes 231 are arranged in the exposed region 28 inside the semiconductor stack 12 to expose the upper surface 121a of the first semiconductor layer 121. The upper protective layer 23b is transparent to the light emitted by the semiconductor stack 12. The material of the upper protective layer 23b is an insulating material, which includes an organic material or an inorganic material. The organic material includes SU-8 photoresist, benzocyclobutene (BCB), perfluorocyclobutane (PFCB), epoxy resin, acrylic resin, cycloolefin polymer (COC), polymethylmethacrylate (PMMA), polyethylene terephthalate (PET), polycarbonate (PC), polyetherimide (PEI), polyimide (PI) or fluorocarbon polymer. The inorganic material includes silicon, glass, silicon oxide, silicon nitride, silicon oxynitride, niobium oxide, hafnium oxide, titanium oxide, magnesium fluoride, or aluminum oxide. The lower protective layer 23a can be formed by atomic layer deposition (ALD), sputtering, evaporation, or spin-coating. Since the first protective layer 23 covers the first sidewall of the exposed region 28. The first protective layer 23 can protect the semiconductor stack 12 and avoid possible damage to the semiconductor stack 12 in the subsequent manufacturing steps. In another embodiment, around the semiconductor stack 12, the upper protective layer 23b further covers the sidewall of the first semiconductor layer 121.

Figure 2F:
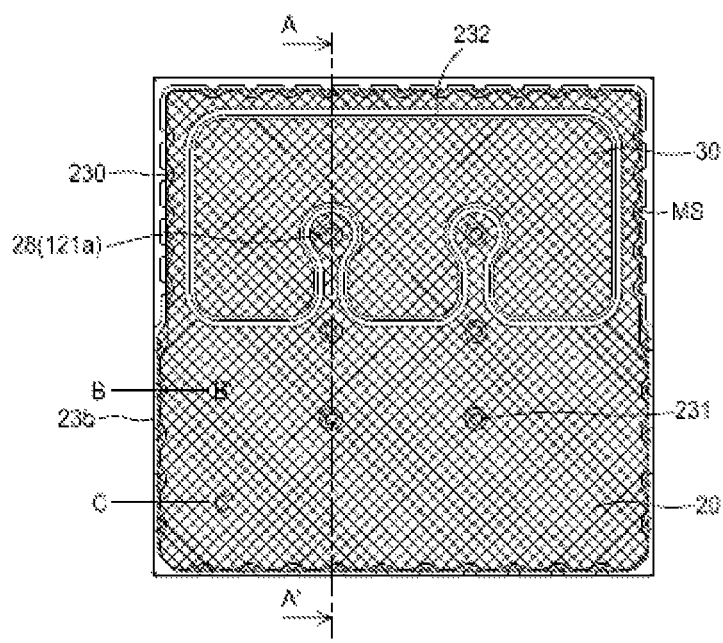
Figure 3E:
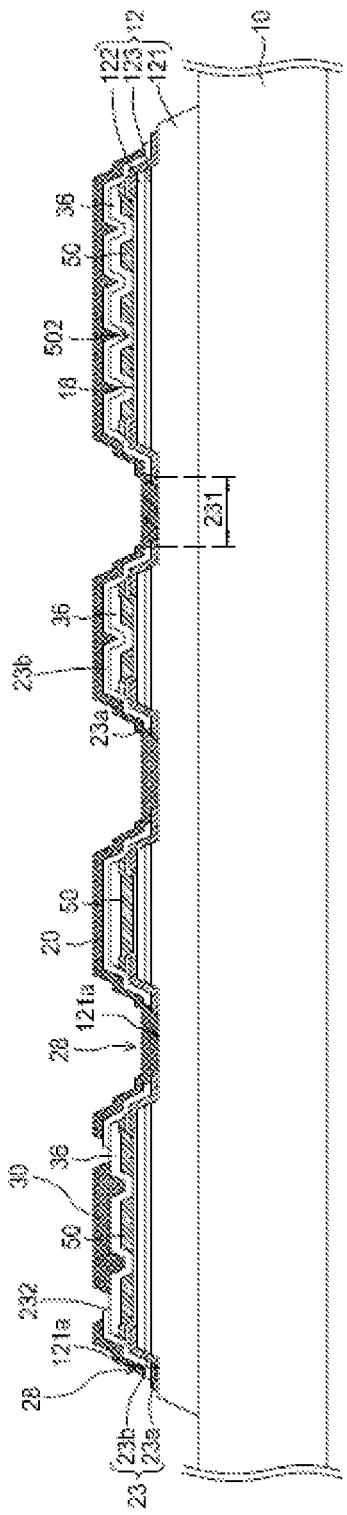

Next, referring to FIG. 2F and FIG. 3E, a first electrode 20 and a second electrode 30 are formed. FIG. 3E shows a cross-sectional view along the line A-A' after the manufacturing steps of FIGS. 2A-2F are completed. FIG. 2F only shows the mesa MS, the upper protective layer 23b, the first electrode 20 and the second electrode 30. The first electrode 20 covers the upper protective layer 23b and contacts the first semiconductor layer 121 at the bottom of the exposed region 28 through the first holes 230 and the second holes 231 to form an electrical connection with the first semiconductor layer 121. The second electrode 30 is separated from the first electrode 20 and formed in the third hole 232 of the upper protective layer 23b to contact the second reflective structure 36 and is electrically connected to the second semiconductor layer 122. The electrode includes a metal material, such as aluminum (Al), chromium (Cr), platinum (Pt), titanium (Ti), tungsten (W), zinc (Zn), or alloys or stacks of the above materials.

Figure 2G:
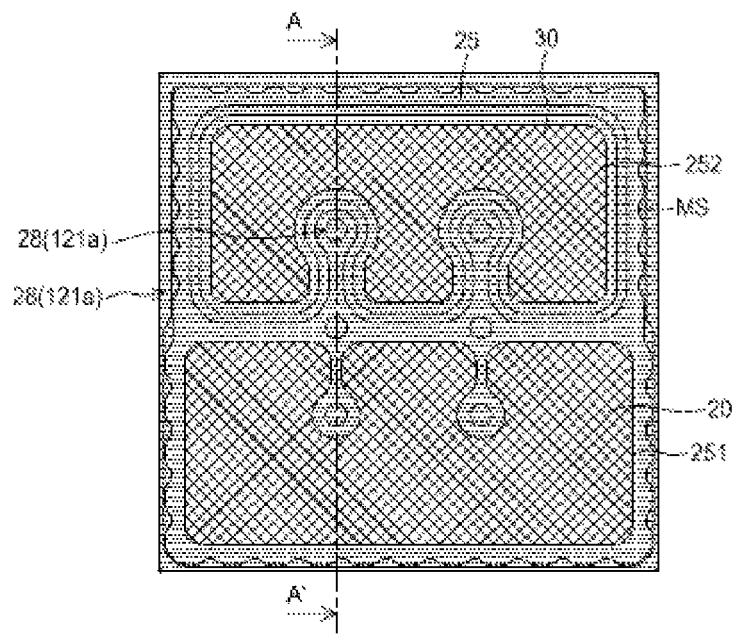
Figure 3F:
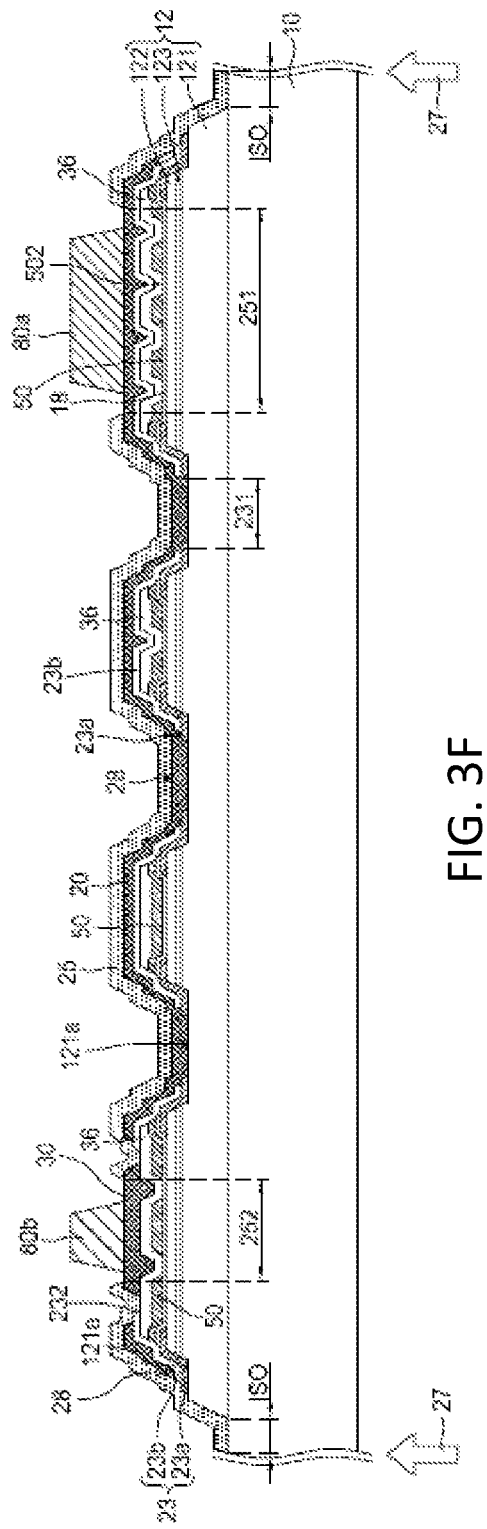

Referring to FIG. 2G, a second protective layer 25 is formed. FIG. 3F shows a cross-sectional view along the line A-A' after the manufacturing steps of FIGS. 2A-2G are completed. FIG. 2G only shows the mesa MS, the first electrode 20, the second electrode 30 and the second protective layer 25.

The second protective layer 25 is formed on the first electrode 20, the second electrode 30 and the exposed region 28, and extends to cover the sidewall of the first semiconductor layer 121 and the isolation region ISO. The second protective layer 25 includes one or multiple fourth holes 251 and fifth holes 252, wherein the fourth hole 251 exposes the first electrode 20 and the fifth hole 252 exposes the second electrode 30. In this embodiment, only one fourth hole 251 and one fifth hole 252 are shown, but the present application is not limited to this, and the upper protective layer 23b may include a plurality of fourth holes 251 and fifth holes 252. The material of the upper protective layer 23b is an insulative material, which includes an organic material or an inorganic material. The organic material includes SU-8 photoresist, benzocyclobutene (BCB), perfluorocyclobutane (PFCB), epoxy resin, acrylic resin, cycloolefin polymer (COC), polymethylmethacrylate (PMMA), polyethylene terephthalate (PET), polycarbonate (PC), polyetherimide (PEI), polyimide (PI) or fluorocarbon polymer. The inorganic material includes silicon, glass, silicon oxide, silicon nitride, silicon oxynitride, niobium oxide, hafnium oxide, titanium oxide, magnesium fluoride, or aluminum oxide. In an embodiment, the second protective layer 25 is formed of alternately stacking a pair or a plurality of pairs of materials with different refractive indexes. For example, the second protective layer 25 can be a reflective structure such as a distributed Bragg reflector (DBR), which is formed of a material stack with different refractive indexes and thickness arranged to reflect the light of a specific wavelength range. In an embodiment, similar to the first reflective structure 50, the second protective layer 25 includes one or multiple stacks of one or multiple pairs of sub-layers, and the second protective layer 25 may further include a bottom layer and/or an upper layer other than the one or multiple pairs of sub-layers. In an embodiment, the second protective layer 25 with the distributed Bragg reflector covers the sidewall of the semiconductor stack 12 located in the isolation region ISO, which facilitates the extraction of light near the isolation region ISO and enhances the brightness of the light-emitting device 1. In an embodiment, the second protective layer 25 with the distributed Bragg reflector includes m pairs of dielectric materials, and the first reflective structure 50 includes n pairs of dielectric materials, wherein m is greater than n. In an embodiment, the thickness of the second protective layer 25 is greater than the thickness of the first reflective structure 50.

In an embodiment, the thickness of the second protective layer 25 may be 1 μm to 6 μm. If the thickness of the second protective layer 25 is less than 1 μm, the thinner thickness may weaken the insulation and moisture resistance of the second protective layer 25 and reduce the reliability of the light-emitting device 1. In an embodiment, the thickness of the second protective layer 25 is greater than the thickness of the upper protective layer 23b.

Figure 2H:
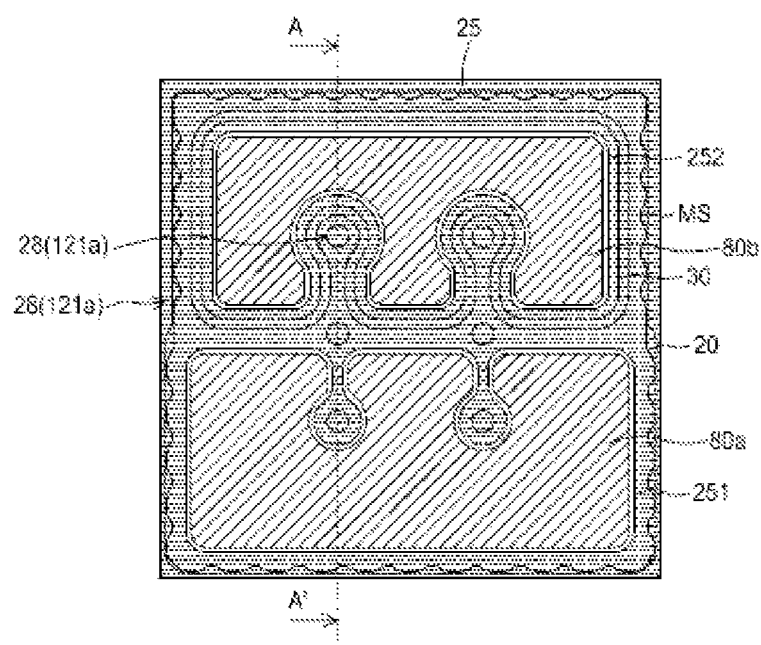

Next, referring to FIG. 2H, a first pad 80a and a second pad 80b are formed. The first pad 80a and the second pad 80b are respectively formed in the fourth hole 251 and the fifth hole 252. FIG. 2H only shows the mesa MS, the first electrode 20, the second electrode 30, the second protective layer 25 and the pad. The first pad 80a is connected to the first electrode 20 and forms an electrical connection with the first semiconductor layer 121. The second pad 80b is connected to the second electrode 30 and forms an electrical connection with the second semiconductor layer 122. The first pad 80a and the second pad 80b include metal materials, such as chromium (Cr), titanium (Ti), tungsten (W), gold (Au), aluminum (Al), indium (In), tin (Sn), nickel (Ni), platinum (Pt) and other metals or stacks or alloys of the above materials. The first pad 80a and the second pad 80b may be composed of a single layer or multiple layers. For example, the first pad 80a and the second pad 80b may include Ti/Au, Ti/Pt/Au, Cr/Au, Cr/Pt/Au, Ni/Au, Ni/Pt/Au, or Cr/Al/Cr/Ni/Au. After the dicing process is completed and the independent light-emitting device 1 is formed, the first pad 80a and the second pad 80b are connected to a circuit on a carrier board (not shown) in a flip-chip form to achieve electrical connection with external electronic components or external power supply. In another embodiment, the first pad 80a and/or the second pad 80b may further cover the second protective layer 25. In another embodiment, the first pad 80a and/or the second pad 80b can avoid the exposed region 28 and are distributed in the internal area of the semiconductor stack 12 to prevent possible peeling of the interface between each layer caused by the height difference between the pad and the semiconductor stack 12. The surfaces of the first pad 80a and the second pad 80b have a plurality of recesses (not shown) corresponding to the second openings 502 of the first reflective structure 50. With these recesses, the bonding force between the pad and the carrier can be improved in the packaging process, so as to improve the process yield.

Next, the semiconductor wafer is divided to form a plurality of light-emitting devices 1 along the isolation region ISO. In an embodiment, as shown in FIG. 3F, a laser 27 is used to irradiate the surface of the substrate 10 opposite to the substrate surface 10a, and the laser 27 is focused on the inside of the substrate 10, so that a deterioration zone (not shown) is formed inside the substrate 10. Cracks are formed on the crystal plane of the substrate 10 to separate the light-emitting devices 1. However, the dicing method of the present application is not limited to this. Any other method suitable for dicing the wafer into light-emitting devices is also applicable.

Figure 4A:
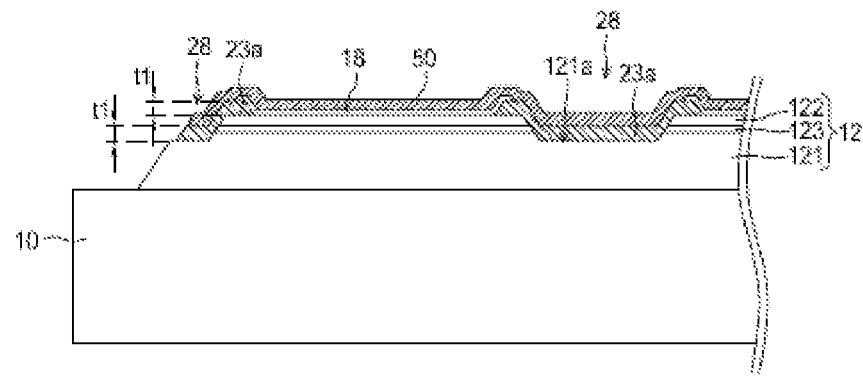
FIGS. 4A-4C show partial cross-sectional views of the light-emitting device 1 in corresponding manufacturing steps.
Figure 4B:
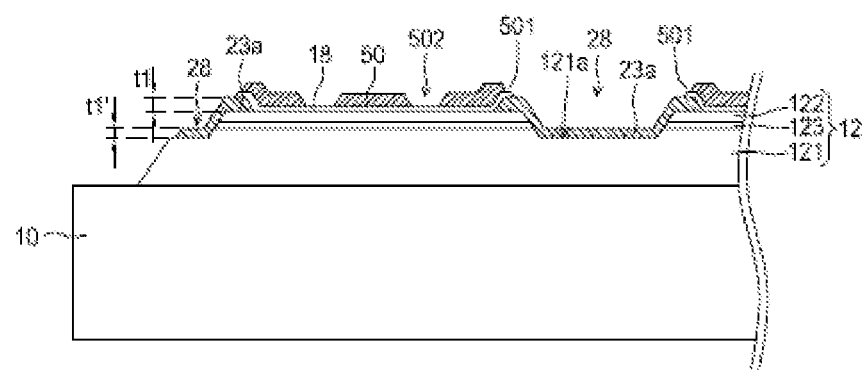
Figure 4C:
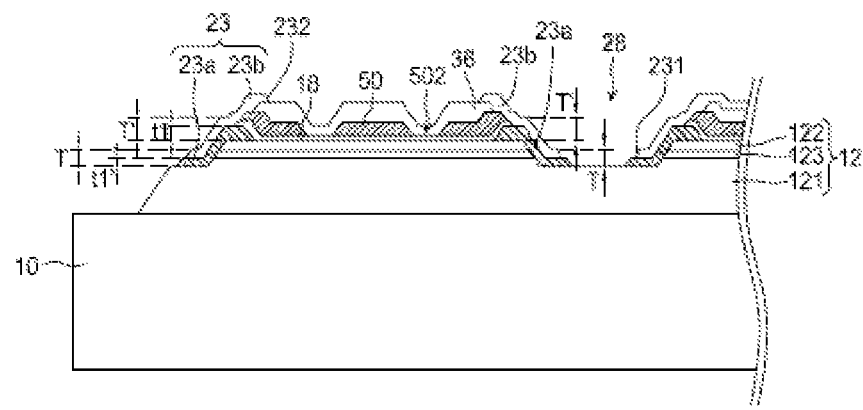

FIGS. 4A-4C show partial cross-sectional views along the line A-A' of the light-emitting device 1 in FIGS. 2A-2E in corresponding manufacturing steps. FIG. 4A shows the lower protective layer 23a, the transparent conductive layer 18 and the first reflective structure 50 on the semiconductor stack 12, wherein the thickness of the lower protective layer 23a on the exposed region 28 is t1. Next, referring to FIG. 4B, the first openings 501 and the second openings 502 are formed in the first reflective structure 50 by etching process, and a portion of the first reflective structure 50 above the exposed region 28 is removed. The etching process includes dry etching, such as inductively coupled plasma (ICP) etching. In an embodiment, the etching process includes dry etching and wet etching. When a portion of the first reflective structure 50 is etched to form the second openings 502, since the transparent conductive layer 18 covers the second semiconductor layer 122, the second semiconductor layer 122 is not damaged by etching. In the embodiment, the transparent conductive layer 18 can be used as an etch stop layer. When a portion of the first reflective structure 50 is etched to form the first openings 501 and a portion of the first reflective structure 50 above the exposed region 28 is removed, since the lower protective layer 23a covers the exposed region 28, the first semiconductor layer 121 at the bottom of the exposed area 28 is not damaged by etching. After the step of etching the first reflective structure 50 is completed, the lower protective layer 23a located in the exposed region 28 has a thickness t1'. The thickness t1' is greater than 100 Å and the thickness t1' is less than the thickness t1. Because the lower protective layer 23a covers and protects the exposed region 28, the first openings 501 can be completely opened without the first reflective structure 50 being left, and the first semiconductor layer 121 can be unharmed. In another embodiment, the first reflective structure 50 on the exposed regions 28 is not removed completely, and only the portion of the first reflective structure 50 on the exposed regions 28 in the inner region of the semiconductor stack 12 is removed.

Next, referring to FIG. 4C, the second reflective structure 36, the upper protective layer 23b, and the first hole 230 (not shown in FIG. 4C), the second hole 231 and the third hole 232 of the upper protective layer are sequentially formed. The upper protective layer 23b and the lower protective layer 23a constitute the first protective layer 23. At the exposed region 28 and near the exposed region 28, the upper protective layer 23b connects to and overlaps the lower protective layer 23a. While forming the first hole 230 and the second hole 231, the portion of the lower protective layer 23a directly under the first hole 230 and the second hole 231 is also removed. That is, the first protective layer 23 has the first holes 230 arranged at intervals to expose the upper surface 121a of the first semiconductor layer, and the second holes 231 are arranged in the exposed region 28 inside the semiconductor stack 12 to expose the upper surface 121a of the first semiconductor layer 121. The first protective layer 23 includes a first part with a first thickness T on the bottom of the exposed region 28, that is, the first thickness T is the sum of the thickness t1' of the lower protective layer 23a and the thickness of the upper protective layer 23b located at the exposed region 28. The first protective layer 23 includes a second part with a second thickness T' on the second semiconductor layer 122. That is, the second thickness T' is the sum of the thickness of the lower protective layer 23a and the thickness of the upper protective layer 23b located at the second semiconductor layer 122, which is larger than the first thickness T. In an embodiment, the difference between the first thickness T and the second thickness T' is greater than 2000 Å. In another embodiment, the difference between the first thickness T and the second thickness T' is greater than 3000 Å. In an embodiment, the thickness t1' of the lower protective layer 23a on the exposed region 28 is smaller than the thickness t1 of the lower protective layer 23a on the second semiconductor layer 122. Next, according to the manufacturing steps in FIGS. 2F-2H described above, the light-emitting device 1 is completed.

Figure 5B:
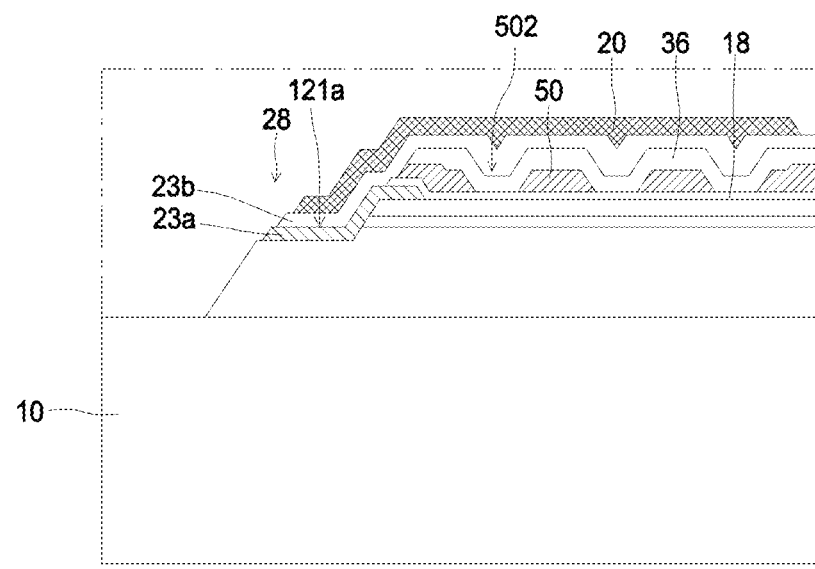

FIGS. 5A and 5B respectively show cross-sectional views along the line B-B' and the line C-C' of the light-emitting device 1 after the manufacturing steps in FIGS. 2A-2F are completed. As shown in FIGS. 2F and 5A, the first electrode 20 contacts the upper surface 121a of the first semiconductor layer 121 exposed by a plurality of the first holes 230 of the first protective layer 23. As shown in FIGS. 2F and 5B, the exposed region 28 around the semiconductor stack 12 includes a portion which the first hole is not disposed, and the first protective layer 23 covers the portion so that the first electrode 20 does not contact the upper surface 121a of the first semiconductor layer 121 in the portion. In this way, the first electrode 20 contacts the upper surface 121a of the first semiconductor layer 121 at intervals through the first holes 230 around the semiconductor stack 12 so that the current is evenly diffused at the exposed region 28 around the semiconductor stack 12.

Figure 1B:
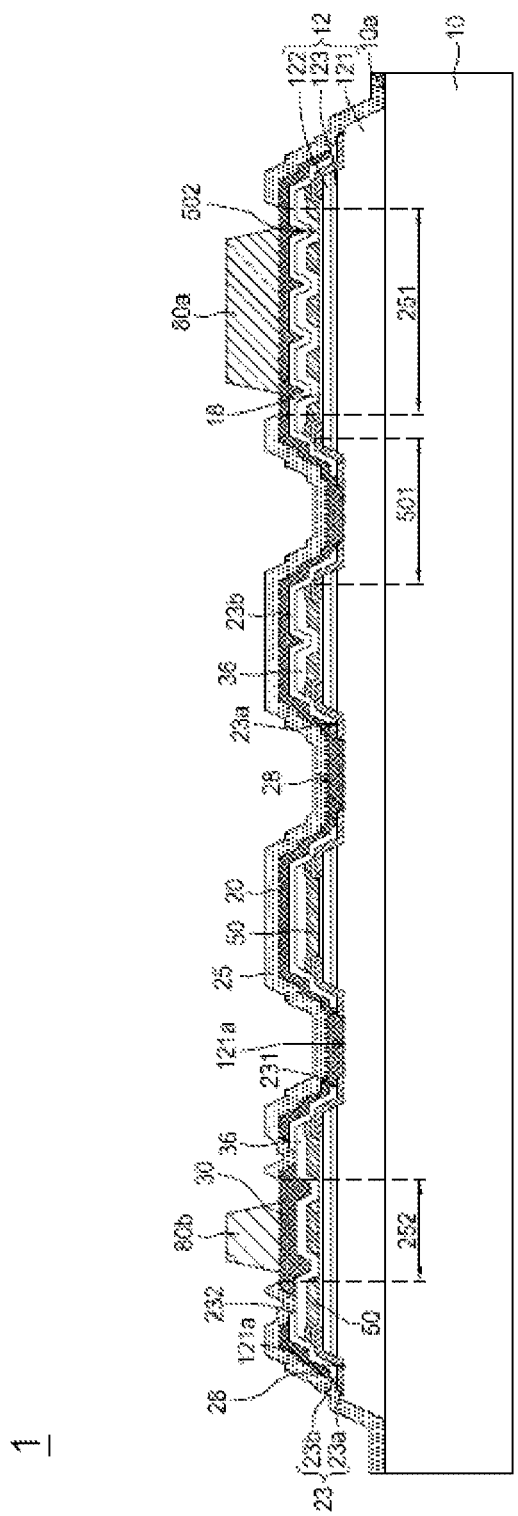
FIG. 1B shows a cross-sectional view of the light-emitting device 1.
Figure 1C:
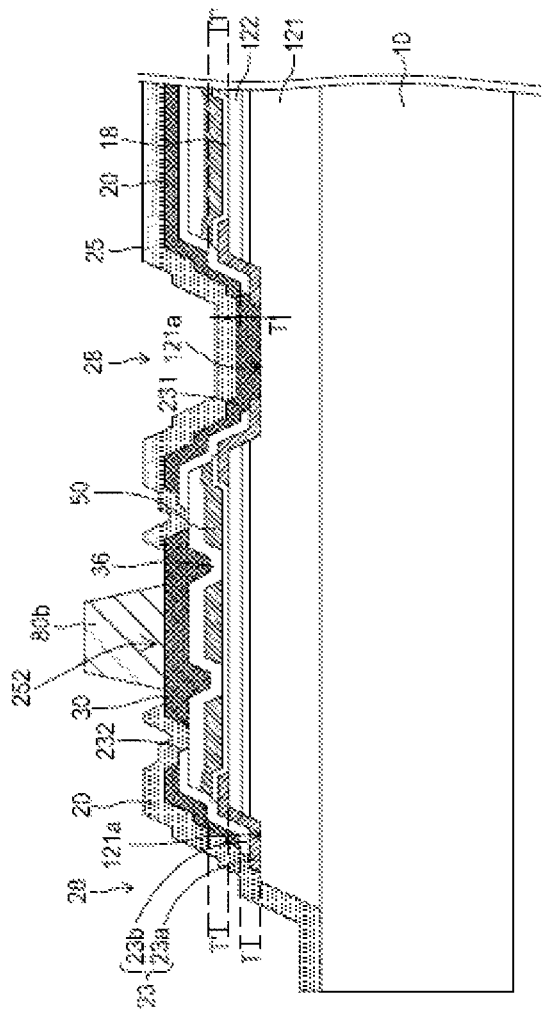
FIG. 1C shows a partial cross-sectional view of the light-emitting device 1.

FIG. 1A shows a top view of a light-emitting device 1 manufactured according to the manufacturing method of this embodiment, FIG. 1B shows a cross-sectional view along the line A-A' in FIG. 1A, and FIG. 1C shows a partial enlarged view of FIG. 1B.

Referring to FIGS. 1A-1C, the light-emitting device 1 includes a substrate 10, a semiconductor stack 12 formed on the substrate 10, an exposed region 28 formed around and inside the semiconductor stack 12 to expose an upper surface 121a of the first semiconductor layer 121, a transparent conductive layer 18 formed on the second semiconductor layer 122, a first reflective structure 50 formed on the transparent conductive layer 18 and including a plurality of second openings 502 to expose the transparent conductive layer 18, and a second reflective structure 36 formed on the first reflective structure 50 and electrically connected to the transparent conductive layer 18 and the second semiconductor layer 122 through the second openings 502. The second reflective structure 36 and the first reflective structure 50 form an omnidirectional reflector (ODR) to improve the reflection of light and the brightness of the light-emitting device 1. The first protective layer 23 covers the exposed region 28 and extends to cover a portion of the second semiconductor layer 122. The first protective layer 23 includes a lower protective layer 23a and an upper semiconductor layer 23b. The lower protective layer 23a contacts the semiconductor stack 12. More specifically, the lower protective layer 23a contacts the first sidewall and a portion of the bottom of the exposed region 28, and the upper protective layer 23b extends from the exposed region 28 to cover the second reflective structure 36 and includes one or multiple third holes 232 to expose the second reflective structure 36. In addition, the first protective layer 23 includes one or multiple second holes 231 on the exposed area 28 in the inner region of the semiconductor stack 12. The one or multiple second holes 231 expose the upper surface 121a of the first semiconductor layer 121. In an embodiment, the first protective layer 23 further includes one or multiple first holes 230 on the exposed area 28 around the semiconductor stack 12. The one or multiple first holes 230 expose the upper surface 121a of the first semiconductor layer 121. The first protective layer 23 includes a first part with a first thickness T on the bottom of the exposed region 28. The first protective layer 23 includes a second part with a second thickness T' on the second semiconductor layer 122, which is larger than the first thickness T. In an embodiment, the difference between the first thickness T and the second thickness T' is greater than 2000 Å. In another embodiment, the difference between the first thickness T and the second thickness T' is greater than 3000 Å.

A first electrode 20 covers the first protective layer 23 and is electrically connected to the first semiconductor layer 121 through the first holes 230 and the second holes 231. A second electrode 30 is separated from the first electrode 20 and contacts the second reflective structure 36 through the third opening 232 to electrically connect to the second semiconductor layer 122. In an embodiment, the second electrode 30 is located in the third opening 232. In another embodiment, the second electrode 30 is located in the third opening 232 and extends to the upper protective layer 23b. A second protective layer 25 is formed on the first electrode 20 and the second electrode 30, and includes a fourth hole 251 to expose the first electrode 20 and a fifth hole 252 to expose the second electrode 30. As shown in FIG. 1B, the second protective layer 25 further covers the sidewall around the semiconductor stack 12 and the substrate surface 10a of the substrate 10. In an embodiment, the second protective layer 25 includes a distributed Bragg reflection structure, which can increase the reflection of light around the semiconductor stack 12 and improve the brightness of the light-emitting device 1. A pad includes a first pad 80a and a second pad 80b. The first pad 80a is formed in the fourth hole 251 and contacts the first electrode 20. The second pad 80b is formed in the fifth hole 252 and contacts the second electrode 30.

Figure 7A:
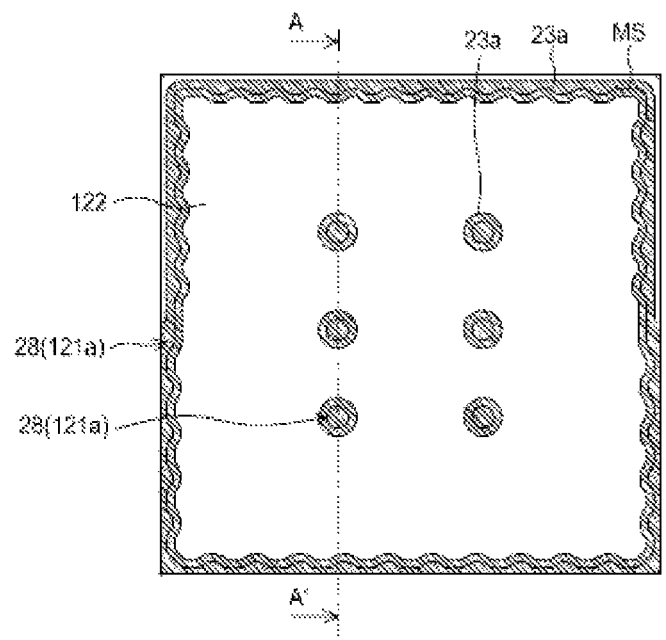
FIGS. 7A-7I show top views of the light-emitting device 2 in corresponding manufacturing steps.
Figure 7B:
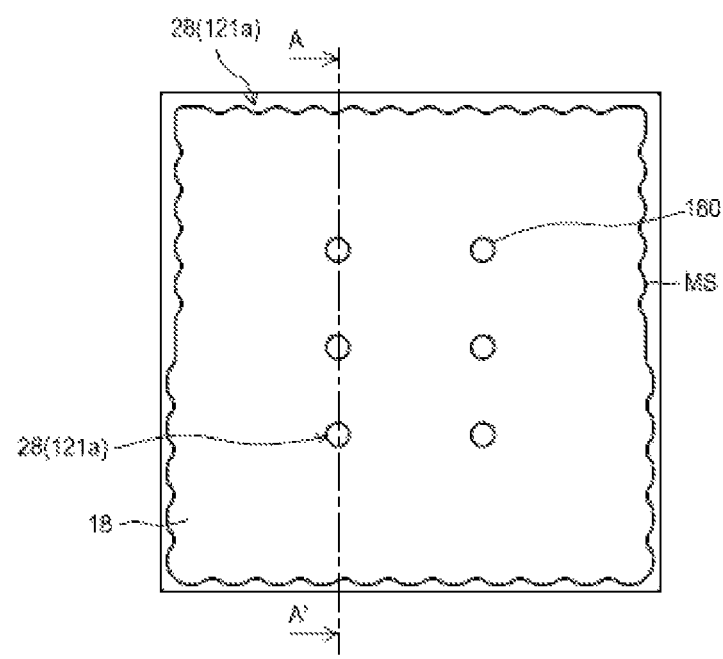

FIG. 1A also shows a top view of the light-emitting device 2 in accordance with an embodiment of the present application. FIGS. 7A-7I show top views of the light-emitting device 2 in corresponding manufacturing steps. FIGS. 8A-8G show cross-sectional views of the light-emitting device 2 in corresponding manufacturing steps. The manufacturing steps and structure of the light-emitting element 2 have some similar parts with that of the light-emitting element 1. The similar parts will not be repeated here and can be referred to the description and drawings of the light-emitting element 1. Most of the manufacturing steps of FIG. 7A to FIG. 7B and FIG. 8A are the same as those described in FIG. 2A to FIG. 2B and FIG. 3A, so the details will not be repeated here. The differences of the manufacturing steps and structure between the light-emitting element 1 and the light-emitting element 2 will be described as follows.

Figure 7C:
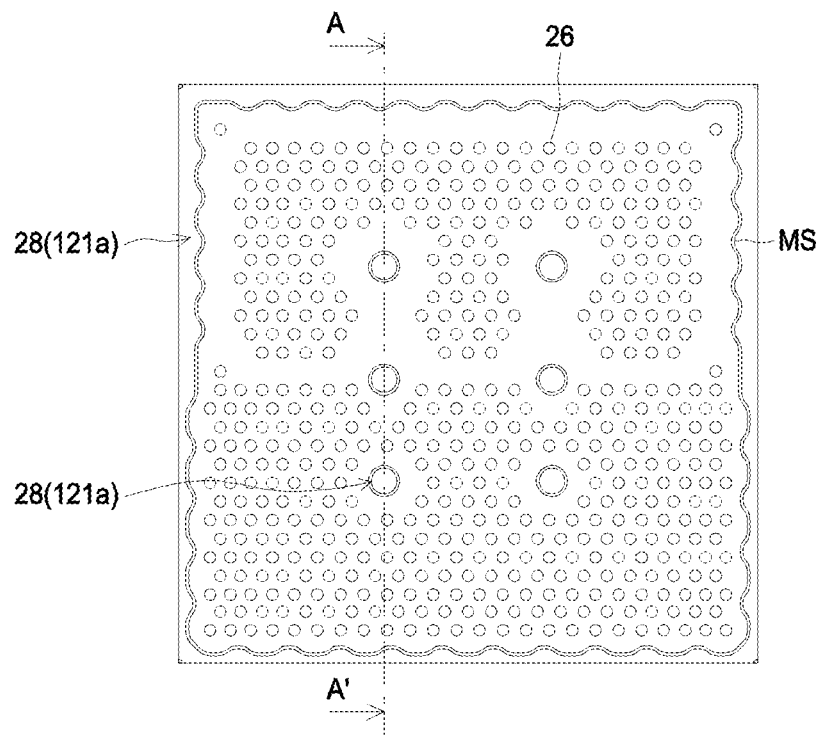
Figure 8A:
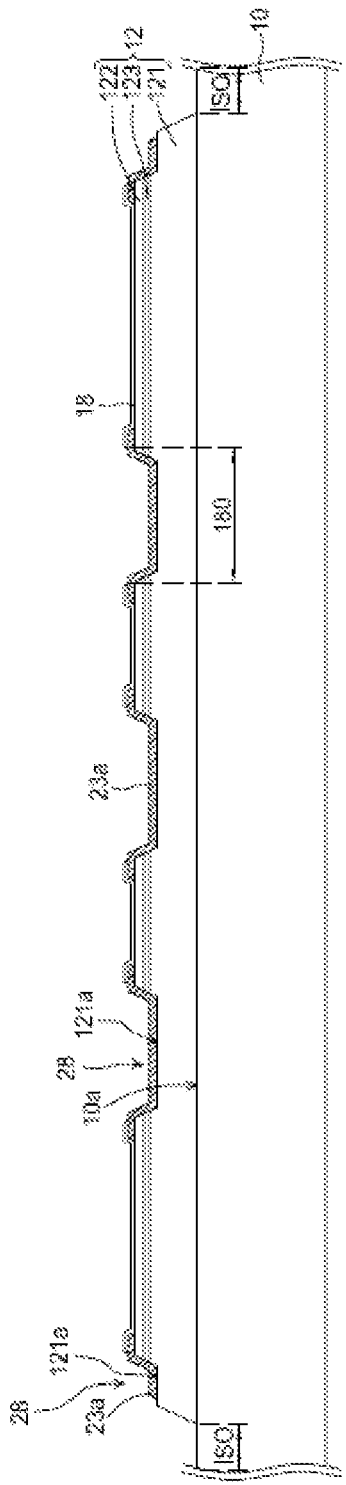
FIGS. 8A-8G show cross-sectional views of the light-emitting device 2 in corresponding manufacturing steps.
Figure 8B:
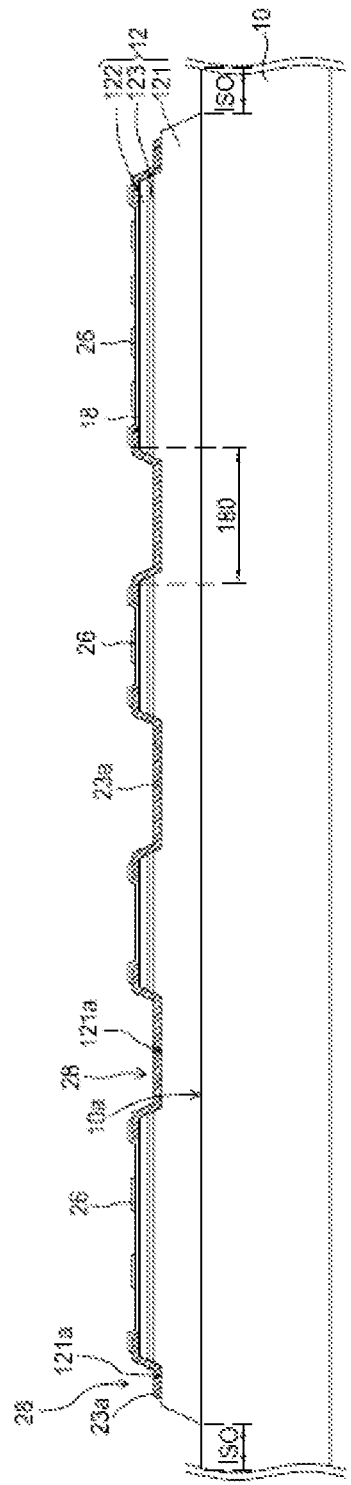

Next, referring to FIGS. 7C and 8B, an etching stop layer 26 is formed. FIG. 8B shows a cross-sectional view along the line A-A' after the manufacturing steps of FIGS. 7A-7C are completed. FIG. 7C only shows the mesa MS, the transparent conductive layer 18 and the etch stop layer 26. First, an etching stop material layer (not shown) is formed on the transparent conductive layer 18, and then the etching stop layer 26 is formed on the transparent conductive layer 18 by lithography and etching or lift-off. The etch stop layer 26 includes a plurality of island-shaped structures separated from each other.

In an embodiment, the etch stop layer 26 includes a metal material, and the metal material includes a reflective metal with high reflectivity to the light emitted by the semiconductor stack 12, such as silver (Ag), gold (Au), aluminum (Al), and titanium (Ti), chromium (Cr), copper (Cu), nickel (Ni), platinum (Pt), ruthenium (Ru) or alloys or stack of the above materials.

In an embodiment, the etch stop layer 26 includes a second barrier layer (not shown) and a contact layer (not shown). The contact layer is formed between the transparent conductive layer 18 and the second barrier layer. The second barrier layer can prevent the migration, diffusion or oxidation of metal elements in the contact layer. The material of the contact layer includes a metal material with high reflectivity for the light emitted by the semiconductor stack 12, such as silver (Ag), gold (Au), aluminum (Al), titanium (Ti), chromium (Cr), copper (Cu), nickel (Ni), platinum (Pt), ruthenium (Ru) or alloys or stacks of the above materials. The material of the first barrier layer includes chromium (Cr), platinum (Pt), titanium (Ti), tungsten (W), zinc (Zn), or alloys or stack of the above materials. In an embodiment, the second barrier layer is a metal stack formed of alternately stacking two or more layers of metal, such as Cr/Pt, Cr/Ti, Cr/TiW, Cr/W, Cr/Zn, Ti/Pt, Ti/W, Ti/TiW, Ti/Zn, Pt/TiW, Pt/W, Pt/Zn, TiW/W, TiW/Zn, or W/Zn.

Figure 7D:
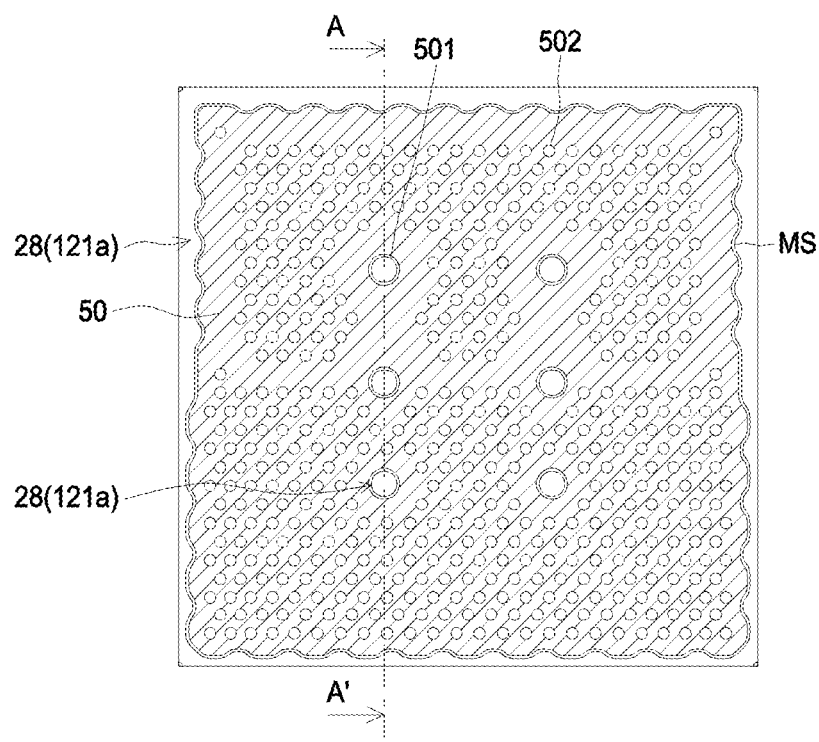
Figures 8C, 8D:
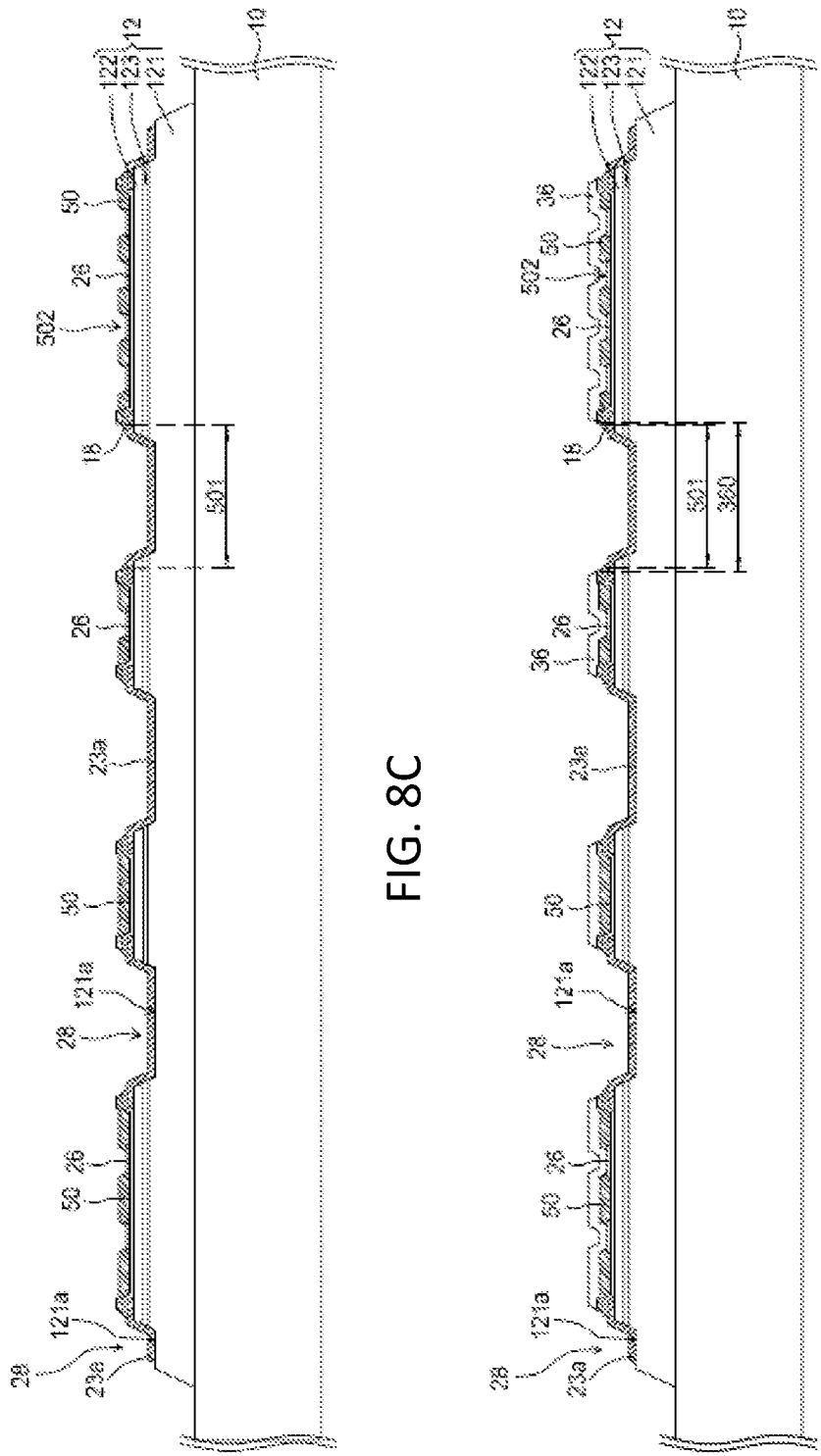
Figure 8E:
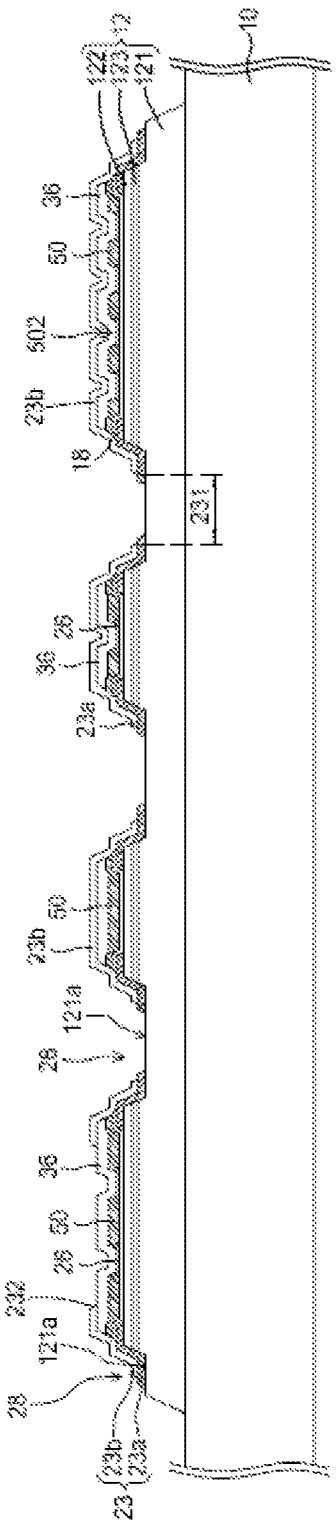
Figure 8F:
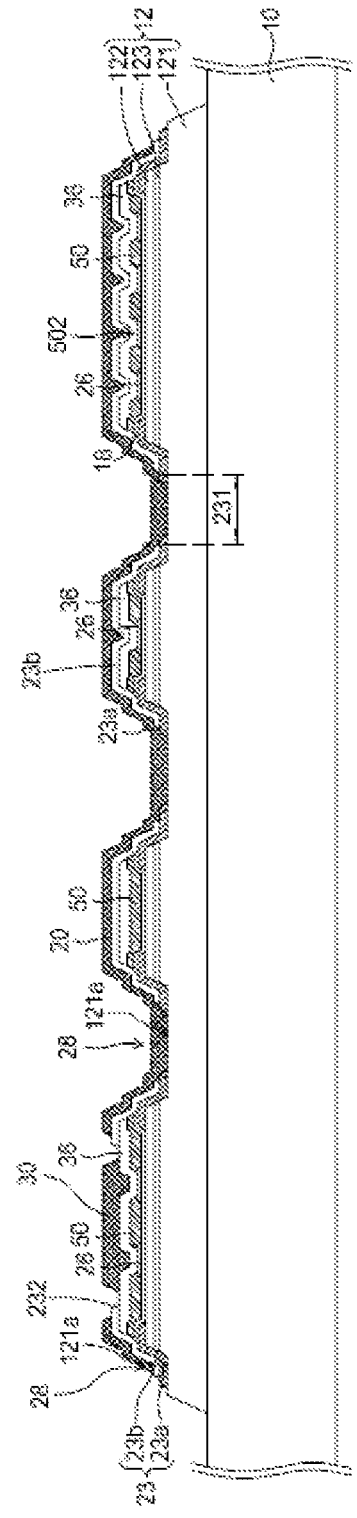
Figure 8G:
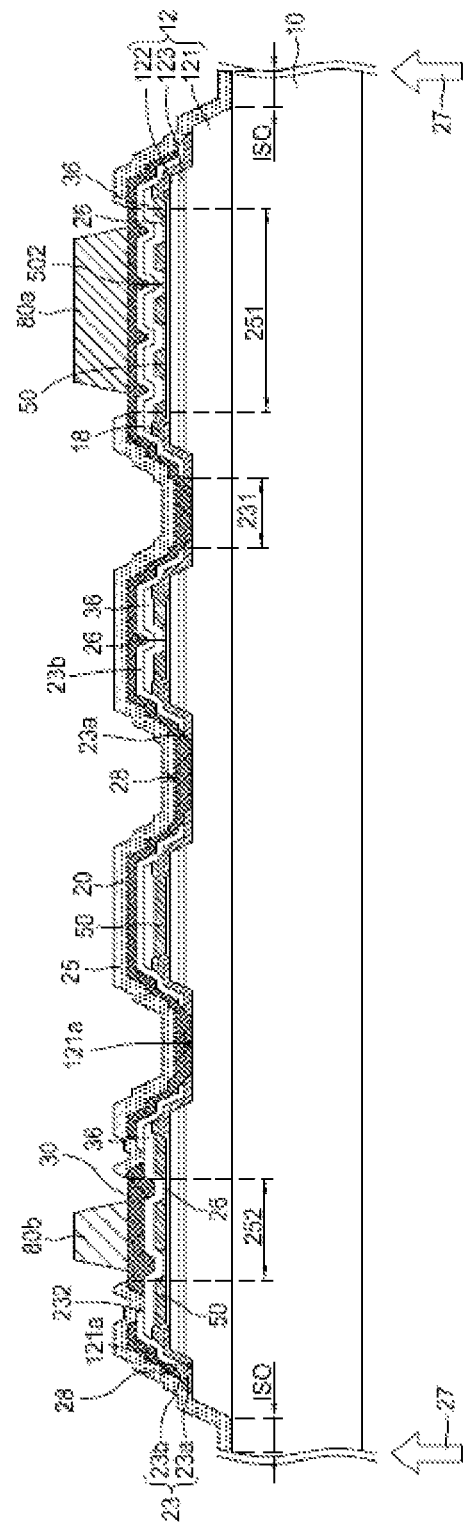

Next, referring to FIGS. 7D and 8C, a first reflective structure 50 is formed. FIG. 8C shows a cross-sectional view along the line A-A' after the manufacturing steps of FIGS. 7A-7D are completed. FIG. 7D only shows the mesa MS and the first reflective structure 50. First, the first reflective structure 50 is formed on the second semiconductor layer 122 and one or multiple first openings 501 and one or multiple second openings 502 separated from each other are formed in the first reflective structure 50 by lithography and etching a portion of the first reflective structure 50. The one or multiple first openings 501 corresponding to the exposed region 28 and the one or multiple vias 180. The one or multiple second openings 502 are distributed on the second semiconductor layer 122 and expose the etch stop layer 26. The material, stack, thickness, and manufacturing method of the first reflective structure 50 are the same as those described in the description of FIGS. 6A-6B, so the details will not be repeated here.

In an embodiment, the etch stop layer 26 includes a central portion exposed by the second opening 502 and an edge portion overlapping the first reflective structure 50 and connected to the central portion. When the first reflective structure 50 is etched, the etch stop layer 26 may be over-etched. Therefore, a thickness of the central part of the etching stop layer 26 is smaller than a thickness of the edge part of the etching stop layer 26.

Figure 7E:
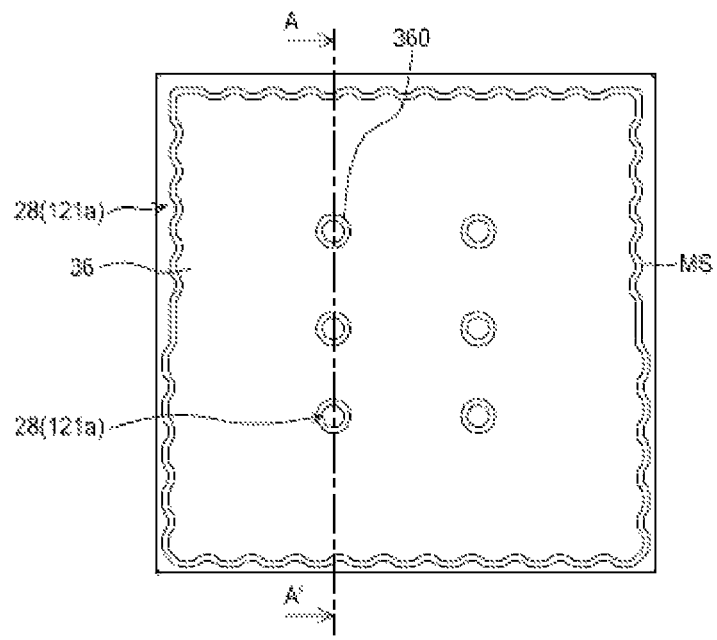
Figure 7F:
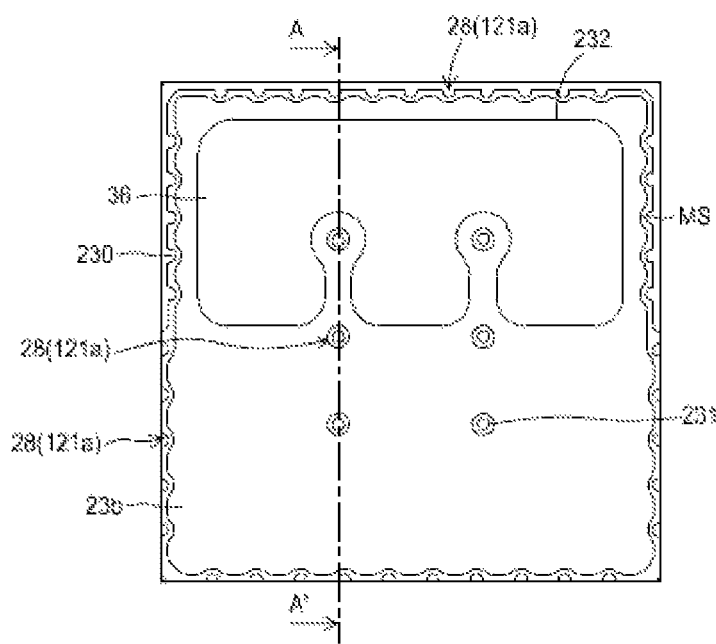

Next, referring to FIGS. 7E and 8D, a second reflective structure 36 is formed. FIG. 8D shows a cross-sectional view along the line A-A' after the manufacturing steps of FIGS. 7A-7E are completed. FIG. 7E only shows the mesa MS and the second reflective structure 36. The second reflective structure 36 is formed on the transparent conductive layer 18, the etch stop layer 26 and the first reflective structure 50, and is electrically connected to the second semiconductor layer 122 through the one or multiple second openings 502, the etch stop layer 26 and the transparent conductive layer 18. The second reflective structure 36 includes one or multiple third openings 360 formed on the exposed region 28 and corresponding to the one or multiple first openings 501. The second reflective structure 36 includes a metal structure including a single metal layer or a stack of multiple metal layers. In an embodiment, the ratio of a projection area of the second semiconductor layer 122 on the substrate 10 to a projection area of the second reflective structure 36 on the substrate 10 is 100%~120%. By adjusting the projection area of the second reflective structure 36 to be close to the projection area of the second semiconductor layer 122 on the substrate 10, the reflective area of the second reflective structure 36 is increased, and the light extraction efficiency of the light-emitting device 2 is improved. The material, stack, thickness, and manufacturing method of the second reflective structure 36 are the same as those described in the description of FIG. 2D and FIG. 3C, so the details will not be repeated here.

Next, the manufacturing steps of FIGS. 7F-7I and FIGS. 8E-8G are the same as those described in FIGS. 2E-2H and FIGS. 3D-3F so the details will not be repeated here.

Figure 9A:
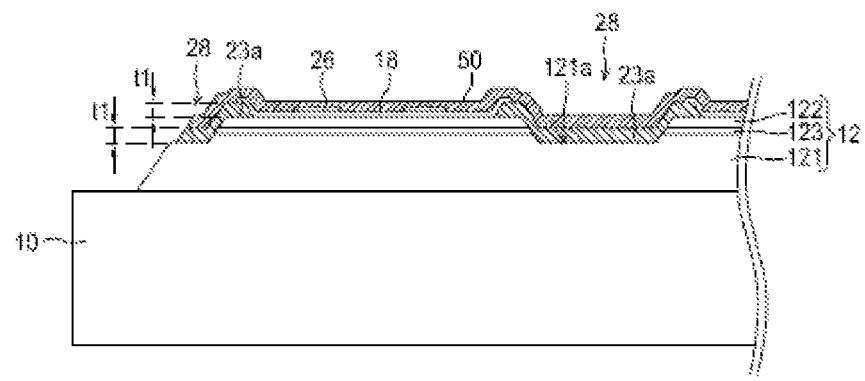
FIGS. 9A-9C show partial cross-sectional views of the light-emitting device 2 in corresponding manufacturing steps.
Figure 9B:
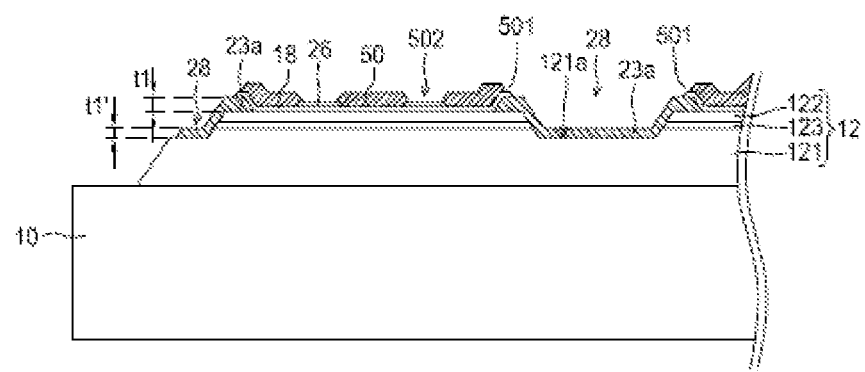
Figure 9C:
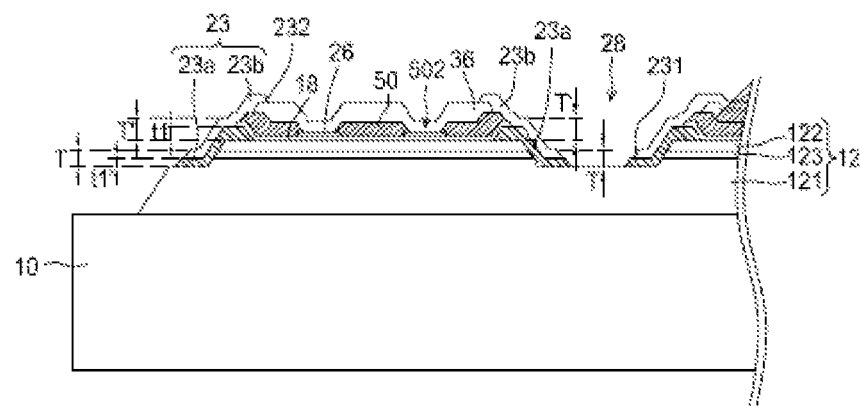

In an embodiment, FIGS. 9A-9C show partial cross-sectional views along the line A-A' of the light-emitting device 2 in FIGS. 7A-7F in corresponding manufacturing steps. FIG. 9A shows the lower protective layer 23a, the transparent conductive layer 18, the etch stop layer 26 and the first reflective structure 50 on the semiconductor stack 12, wherein a portion of the first reflective structure 50 is formed on the lower protective layer 23a at the exposed region 28. The thickness of the lower protective layer 23a on the exposed region 28 is t1. Next, referring to FIG. 9B, the first openings 501 and the second openings 502 are formed in the first reflective structure 50 by etching process, and the portion of the first reflective structure 50 above the exposed region 28 is removed. The etching process includes dry etching, such as inductively coupled plasma (ICP) etching. In an embodiment, the etching process includes dry etching and wet etching. When a portion of the first reflective structure 50 is etched to form the second openings 502, since the etch stop layer 26 covers the transparent conductive layer 18, the transparent conductive layer 18 is not damaged by etching. When a portion of the first reflective structure 50 is etched to form the first openings 501 and a portion of the first reflective structure 50 above the exposed region 28 is removed, since the lower protective layer 23a covers the exposed region 28, the first semiconductor layer 121 at the bottom of the exposed area 28 is not damaged by etching. After the step of etching the first reflective structure 50 is completed, the lower protective layer 23a located in the exposed region 28 has a thickness t1'. The thickness t1' is greater than 100 Å and the thickness t1' is less than the thickness t1. Because the lower protective layer 23a covers and protects the exposed region 28, the first openings 501 can be completely opened without the first reflective structure 50 being left, and the first semiconductor layer 121 can be not unharmed. In another embodiment, the first reflective structure 50 on the exposed regions 28 is not removed completely, and only the portion of the first reflective structure 50 on the exposed regions 28 in the inner region of the semiconductor stack 12 is removed. Referring to FIG. 9C, the stacking relationship between the first protective layer 23 and other layers and the difference in thickness at different positions are the same as those described in FIG. 4C, so the details will not be repeated here.

Figure 7G:
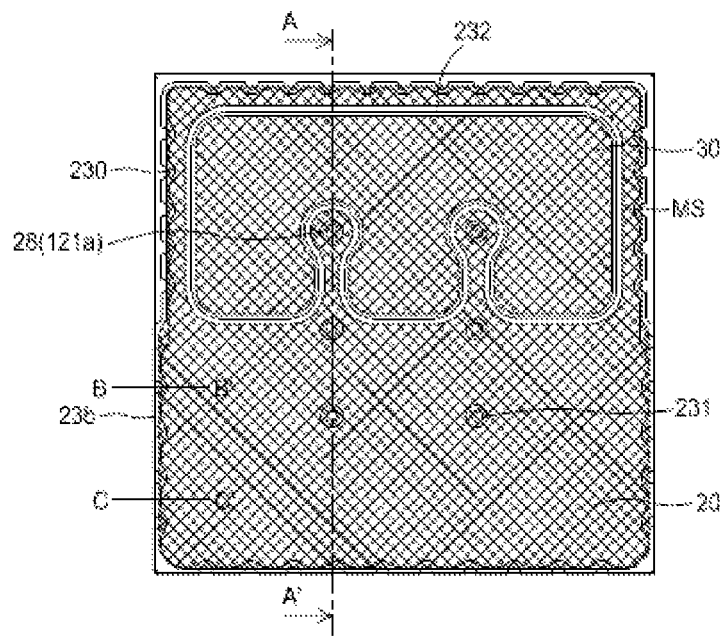
Figure 7H:
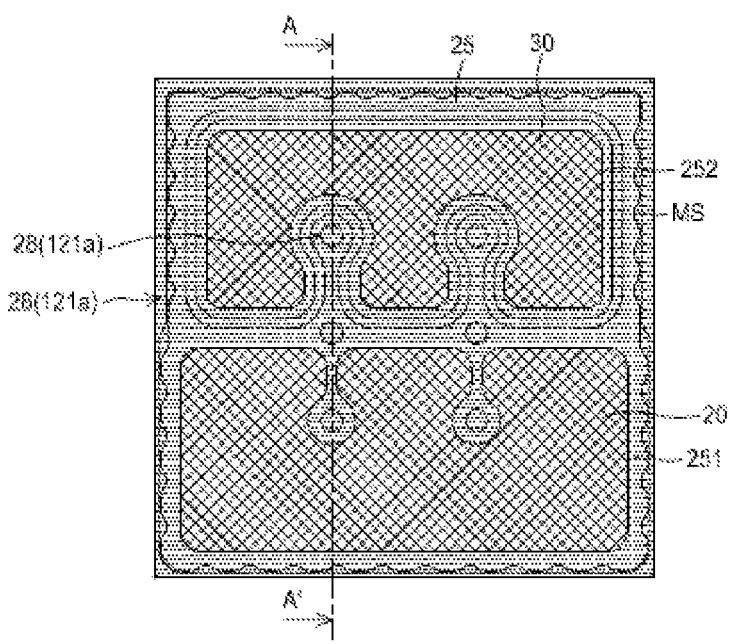
Figure 7I:
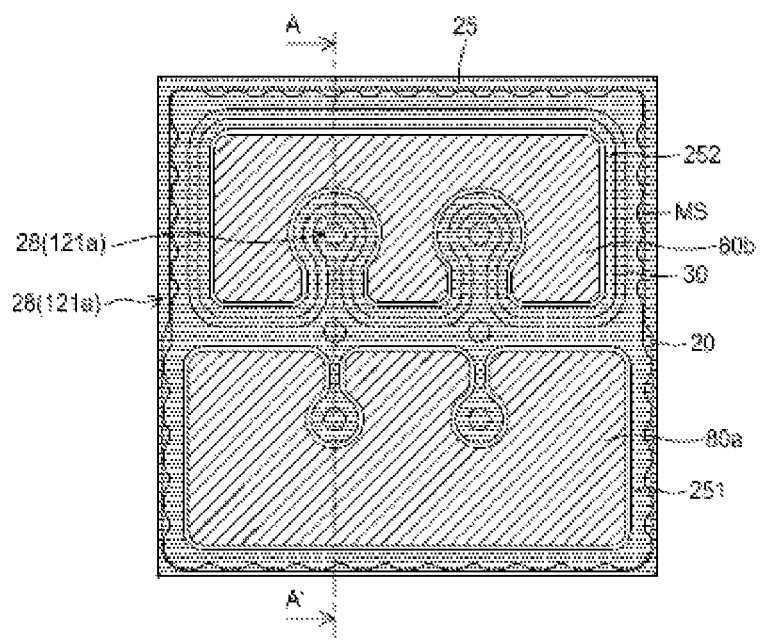
Figure 10A:
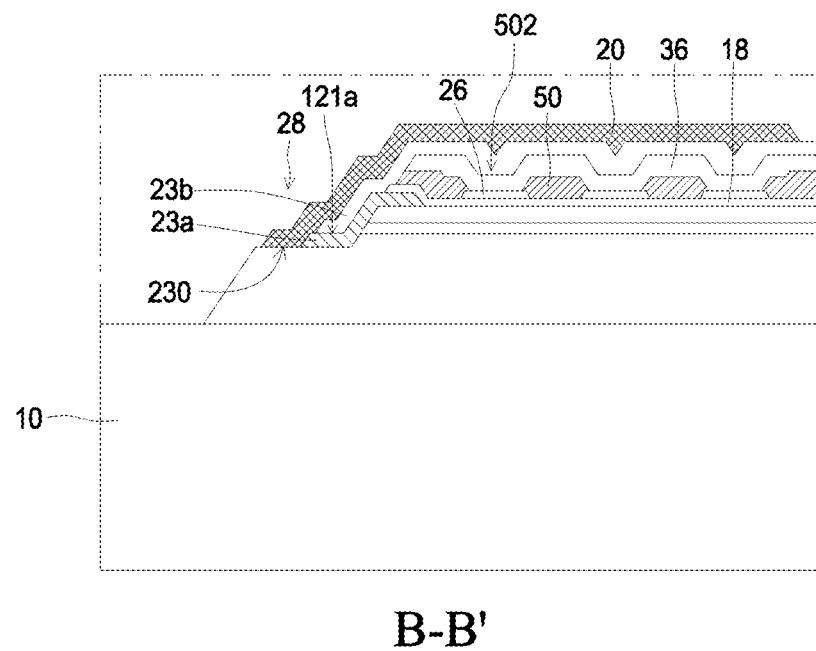
FIGS. 10A-10B show partial cross-sectional views of the light-emitting device 2 in corresponding manufacturing steps.
Figure 10B:
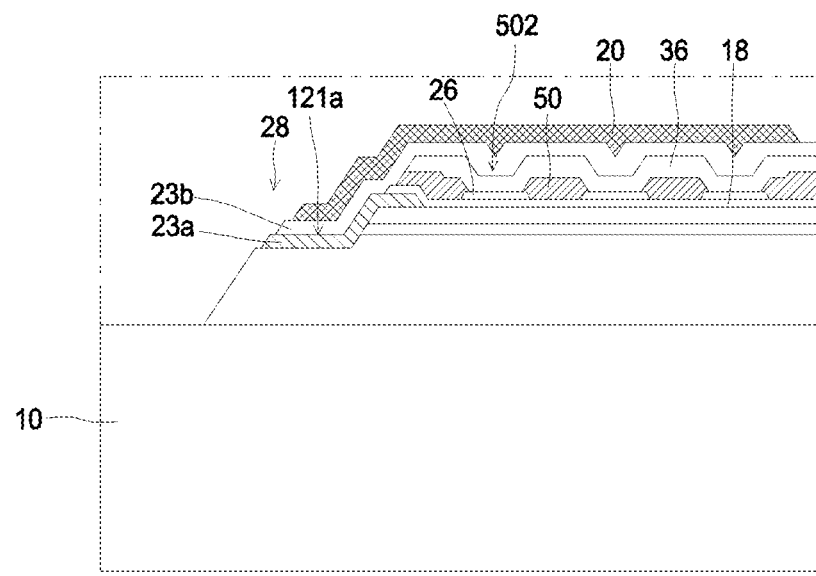

FIGS. 10A-10B respectively show cross-sectional views of FIG. 7G along the line B-B' and the line C-C' after the manufacturing steps of FIG. 7A-7G are completed. Referring to FIGS. 7G and 10A-10B, the stacking relationship between the first electrode 20, the first protective layer 23, and the semiconductor stack 12 are the same as those described in FIGS. 2F and 5A-5B so the details will not be repeated here.

Figure 1D:
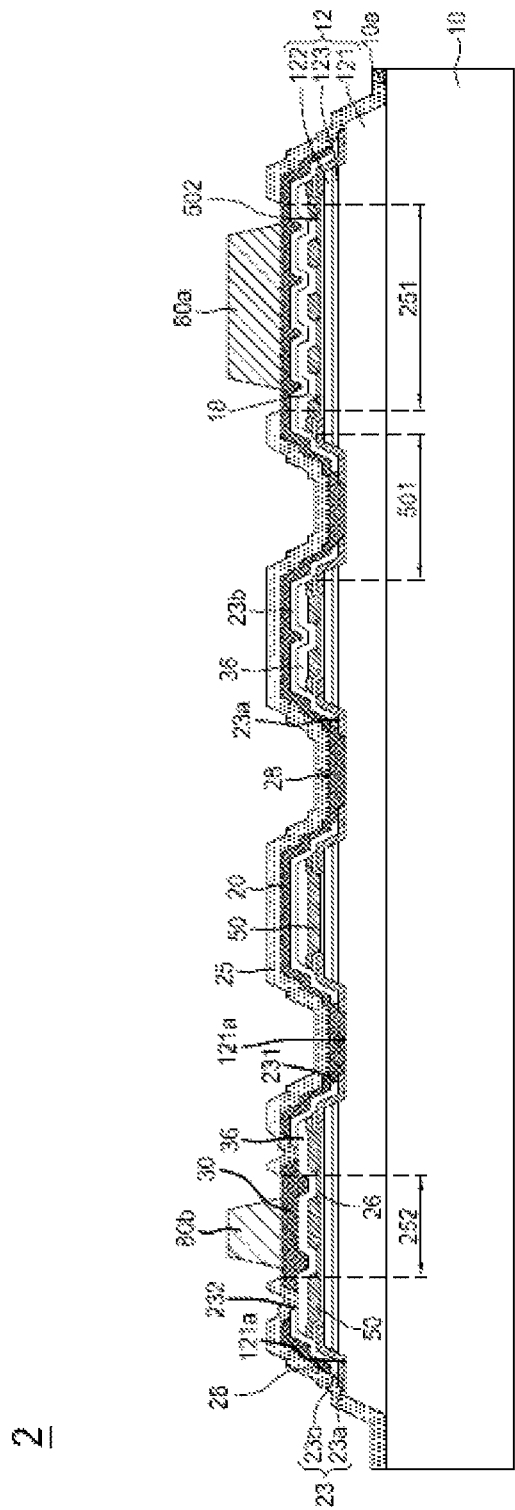
FIG. 1D shows a cross-sectional view of the light-emitting device 2.
Figure 1E:
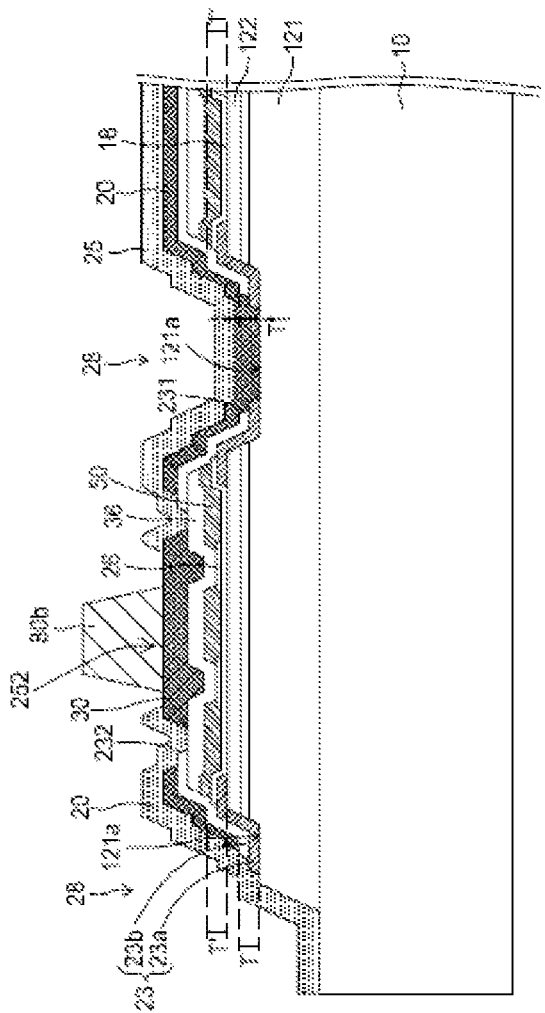
FIG. 1E shows a partial cross-sectional view of the light-emitting device 2.

FIG. 1A shows a top view of a light-emitting device 2 manufactured according to the manufacturing method of this embodiment, FIG. 1D shows a cross-sectional view along the line A-A' in FIG. 1A, and FIG. 1E shows a partial enlarged view of FIG. 1D.

Referring to FIGS. 1A and 1D-1E, the light-emitting device 2 includes a substrate 10, a semiconductor stack 12 formed on the substrate 10, and an exposed region 28 formed around and inside the semiconductor stack 12 to expose an upper surface 121a of the first semiconductor layer 121, a transparent conductive layer 18 formed on the second semiconductor layer 122, an etch stop layer 26 formed on the transparent conductive layer 18 and including a plurality of island-shaped structures, a first reflective structure 50 formed on the transparent conductive layer 18 and the etch stop layer 26, and including a plurality of second openings 502 to expose the etch stop layer 26, and a second reflective structure 36 formed on the first reflective structure 50 and electrically connected to the etch stop layer 26, transparent conductive layer 18 and the second semiconductor layer 122 through the second openings 502. The second reflective structure 36 and the first reflective structure 50 form an omnidirectional reflector (ODR) to improve the reflection of light and the brightness of the light-emitting device 2. However, the stacking relationship between the first protective layer 23 and other layers, the thicknesses of the first protective layer 23 at different positions, and the stacking relationship between the first electrode 20, the second electrode 30, the first pad 80a and the second pad 80b are the same as those described in FIGS. 1B-1C so the details will not be repeated here.

Figure 11:
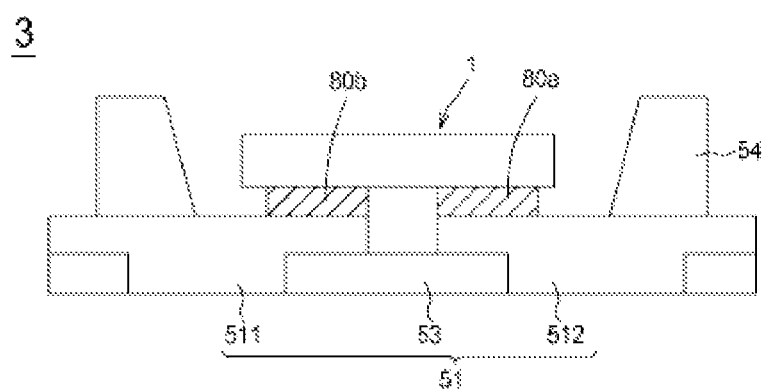
FIG. 11 shows a schematic diagram of the light-emitting element 3 in accordance with an embodiment of the present application.

FIG. 11 is a schematic diagram of a light-emitting element 3 according to an embodiment of the present application. The light-emitting element 3 includes a carrier 51, a first bonding pad 511 and a second bonding pad 512 formed on the carrier 51. The light-emitting devices 1 and 2 in the foregoing embodiment are mounted on the first bonding pad 511 and the second bonding pad 512 in the form of flip chip. The first bonding pad 511 and the second bonding pad 512 are electrically insulated by an insulating portion 53 including an insulating material. The flip chip uses the side of the substrate 10 opposite to the pad as the light-emitting surface. In order to increase the light extraction efficiency of the light-emitting element 3, a reflective structure 54 can be provided around the light-emitting devices 1 and 2.

Figure 12:
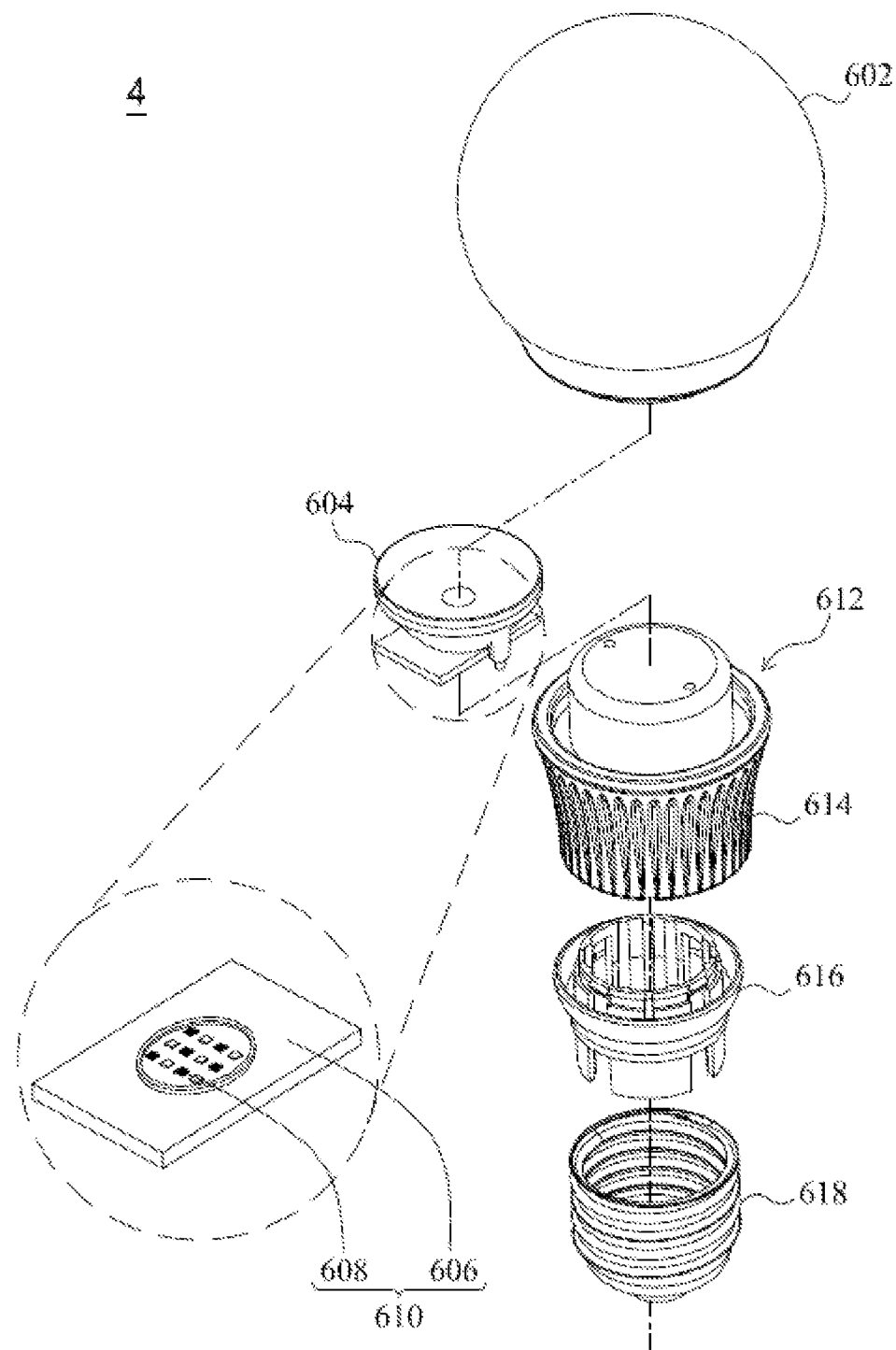
FIG. 12 shows a schematic diagram of the light-emitting apparatus 4 in accordance with an embodiment of the present application.

FIG. 12 is a schematic diagram of a light-emitting apparatus 4 according to an embodiment of the present application. The light-emitting apparatus 4 includes a lampshade 602, a reflector 604, a light-emitting module 610, a lamp holder 612, a heat sink 614, a connection portion 616, and an electrical connection element 618. The light-emitting module 610 includes a supporting portion 606, and a plurality of light-emitting units 608 are located on the supporting portion 606, wherein the light-emitting units 608 may be the light-emitting devices 1, 2 or the light-emitting element 3 in the foregoing embodiment.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

What is claimed is:

1. A light-emitting device, comprising:
   a semiconductor stack comprising a first semiconductor layer, a second semiconductor layer and an active area between the first semiconductor layer and the second semiconductor layer, wherein the first semiconductor layer comprising an upper surface;
   multiple exposed regions formed in the semiconductor stack to expose the upper surface, wherein in a top view, the multiple exposed regions are disposed in an inner region of the semiconductor stack;
   a first reflective structure formed on the second semiconductor layer and comprising multiple openings and a periphery surrounding the multiple openings, wherein in the top view, a shortest gap between one of the multiple openings and one of the multiple exposed regions is d1, and a shortest gap between two adjacent openings of the multiple openings is d2, and d1 is greater than d2;

a second metal reflective structure formed on the first reflective structure, filled in the multiple openings, and electrically connected to the second semiconductor layer; and a first protective layer covering the multiple exposed regions and a portion of the second semiconductor layer, and directly and physically contacting the semiconductor stack, wherein the first protective layer comprises an end portion contacting the upper surface and extending beyond a portion of the periphery of the first reflective structure in a cross-sectional view;

wherein the first reflective structure comprises dielectric material.

2. The light-emitting device of claim 1, further comprising an etch stop layer formed between the second semiconductor layer and the first reflective structure, wherein the multiple openings expose the etch stop layer.

3. The light-emitting device of claim 2, wherein the etch stop layer comprises a transparent conductive layer.

4. The light-emitting device of claim 2, wherein the etch stop layer comprises a metal structure.

5. The light-emitting device of claim 2, wherein the etch stop layer comprises a barrier layer and a contact layer formed between the second semiconductor layer and the barrier layer.

6. The light-emitting device of claim 2, wherein the etch stop layer comprises a central portion exposed by one of the multiple openings and an edge portion overlapping the first reflective structure and connected to the central portion, and wherein the central portion has a third thickness and the edge portion has a fourth thickness, the third thickness is smaller than the fourth thickness.

7. The light-emitting device of claim 1, the first protective layer comprises a first part formed on the upper surface and a second part formed on the second semiconductor layer, the first part has a first thickness and the second part has a second thickness, and the first thickness is smaller than the second thickness.

8. The light-emitting device of claim 1, wherein the first protective layer comprises a lower protective layer and an upper protective layer, the lower protective layer contacts the semiconductor stack and the upper protective layer is formed on the second metal reflective structure; and wherein the first reflective structure is disposed between the lower protective layer and the upper protective layer.

9. The light-emitting device of claim 1, the first reflective structure comprises a plurality of pairs of dielectric-material layers with different refractive indexes.

10. The light-emitting device of claim 1, further comprising:
a transparent conductive layer formed under the first reflective structure;
an electrode formed on the metal second reflective structure;
a second protective layer formed on the electrode, covering the multiple exposed regions and comprising a hole to expose the electrode; and
a pad electrically connected to the electrode through the hole.

11. The light-emitting device of claim 10, wherein the second protective layer comprises a distributed Bragg reflector.

12. The light-emitting device of claim 1, further comprising an electrode formed on the first protective layer, wherein the semiconductor stack comprises a surrounding region, the first protective layer comprises one or multiple holes formed on the surrounding region, and the electrode contacts the upper surface through the one or multiple holes.

13. The light-emitting device of claim 1, further comprising a substrate which the semiconductor stack formed thereon;
wherein the second semiconductor layer has a first projection area on the substrate and the second metal reflective structure has a second projection area on the substrate, and wherein a ratio of the first projection area and the second projection area is between 100% and 120%.

14. A light-emitting device, comprising:
a semiconductor stack comprising a first semiconductor layer, a second semiconductor layer and an active area between the first semiconductor layer and the second semiconductor layer, wherein the first semiconductor layer comprising an upper surface;
an exposed region formed in the semiconductor stack to expose the upper surface;
a transparent conductive layer formed on the second semiconductor layer;
an etch stop layer formed on the transparent conductive layer;
a first reflective structure formed on the etch stop layer and comprising one or multiple openings to expose a top surface of the etch stop layer, wherein the etch stop layer is formed in the one or multiple openings and wherein the first reflective structure comprises dielectric material;
a second metal reflective structure formed on the first reflective structure, filled in the one or multiple openings, and electrically connected to the second semiconductor layer through the one or multiple openings;
an electrode formed on the second metal reflective structure;
a second protective layer formed on the electrode, covering the exposed region and comprising a hole to expose the electrode; and
a pad electrically connected to the electrode through the hole;
wherein the second semiconductor layer and the etch stop layer are disposed on opposite sides of the transparent conductive layer.

15. The light-emitting device of claim 14, wherein the etch stop layer comprises a metal structure.

16. The light-emitting device of claim 14, wherein in a top view, the etch stop layer comprises a plurality of island-shaped structures separated from each other.

17. The light-emitting device of claim 14, further comprising a substrate which the semiconductor stack formed thereon;
wherein the second semiconductor layer has a first projection area on the substrate and the second metal reflective structure has a second projection area on the substrate, and wherein a ratio of the first projection area and the second projection area is between 100% and 120%.

18. The light-emitting device of claim 14, wherein the first reflective structure comprises a plurality of pairs of dielectric-material layers with different refractive indexes.

19. The light-emitting device of claim 14, wherein the second protective layer comprises a distributed Bragg reflector.

* * * * *